(12) United States Patent
Nagata

(10) Patent No.: US 11,183,569 B2
(45) Date of Patent: Nov. 23, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 61 days.

(21) Appl. No.: 16/655,869

(22) Filed: Oct. 17, 2019

(65) Prior Publication Data

US 2020/0185500 A1    Jun. 11, 2020

(30) Foreign Application Priority Data

Dec. 7, 2018 (JP) .............................. JP2018-229561

(51) Int. Cl.
*H01L 29/40* (2006.01)
*H01L 29/06* (2006.01)
(Continued)

(52) U.S. Cl.
CPC ........ *H01L 29/405* (2013.01); *H01L 21/2253* (2013.01); *H01L 21/26513* (2013.01);
(Continued)

(58) Field of Classification Search
CPC ............... H01L 29/405; H01L 29/0696; H01L 29/1087; H01L 29/1095; H01L 29/407; H01L 29/66333; H01L 29/7395
(Continued)

(56) References Cited

U.S. PATENT DOCUMENTS

2005/0161768 A1* 7/2005 Sugiyama ........... H01L 29/4232
257/565
2006/0273382 A1* 12/2006 Hshieh .............. H01L 29/41766
257/330
(Continued)

FOREIGN PATENT DOCUMENTS

JP    2003-197914 A    7/2003

OTHER PUBLICATIONS

English Machine translation of JP 2003197914 (Year: 2003).*

*Primary Examiner* — Dzung Tran
(74) *Attorney, Agent, or Firm* — McDermott Will & Emery LLP

(57) ABSTRACT

A semiconductor device and a method of manufacturing a semiconductor device capable of suppressing breakdown due to current concentration while suppressing an increase in chip size are provided. According to one embodiment, a semiconductor device has a gate resistance on a main surface side of a semiconductor substrate, a first contact and a second contact connected to an upper surface of the gate resistance, and a carrier discharging portion that discharges the carrier formed in the semiconductor substrate below the gate resistance, the gate resistance having a first contacting portion to which a first contact is connected, a second contacting portion to which a second contact is connected, and a plurality of extending portions with one end connected to the first contacting portion and the other end connected to the second contacting portion. The gate resistance forms an opening between adjacent extending portions and the carrier discharge portion is formed in the opening.

12 Claims, 18 Drawing Sheets

(51) Int. Cl.
*H01L 29/10* (2006.01)
*H01L 21/765* (2006.01)
*H01L 29/66* (2006.01)
*H01L 21/265* (2006.01)
*H01L 21/324* (2006.01)
*H01L 21/225* (2006.01)
*H01L 21/74* (2006.01)
*H01L 29/739* (2006.01)

(52) U.S. Cl.
CPC .......... *H01L 21/324* (2013.01); *H01L 21/743* (2013.01); *H01L 21/765* (2013.01); *H01L 29/0696* (2013.01); *H01L 29/1087* (2013.01); *H01L 29/1095* (2013.01); *H01L 29/407* (2013.01); *H01L 29/66333* (2013.01); *H01L 29/7395* (2013.01)

(58) Field of Classification Search
USPC ........................................................ 257/139
See application file for complete search history.

(56) References Cited

U.S. PATENT DOCUMENTS

| | | | | |
|---|---|---|---|---|
| 2007/0290257 A1* | 12/2007 | Kraft | ..................... | H01L 29/407 257/330 |
| 2008/0290407 A1* | 11/2008 | Kusunoki | ........... | H01L 29/4232 257/334 |
| 2013/0082235 A1* | 4/2013 | Gu | ....................... | H01L 21/2007 257/9 |
| 2016/0276425 A1* | 9/2016 | Saito | ................... | H01L 23/5228 |
| 2016/0379992 A1* | 12/2016 | Nagao | .................. | H01L 23/528 257/77 |

* cited by examiner

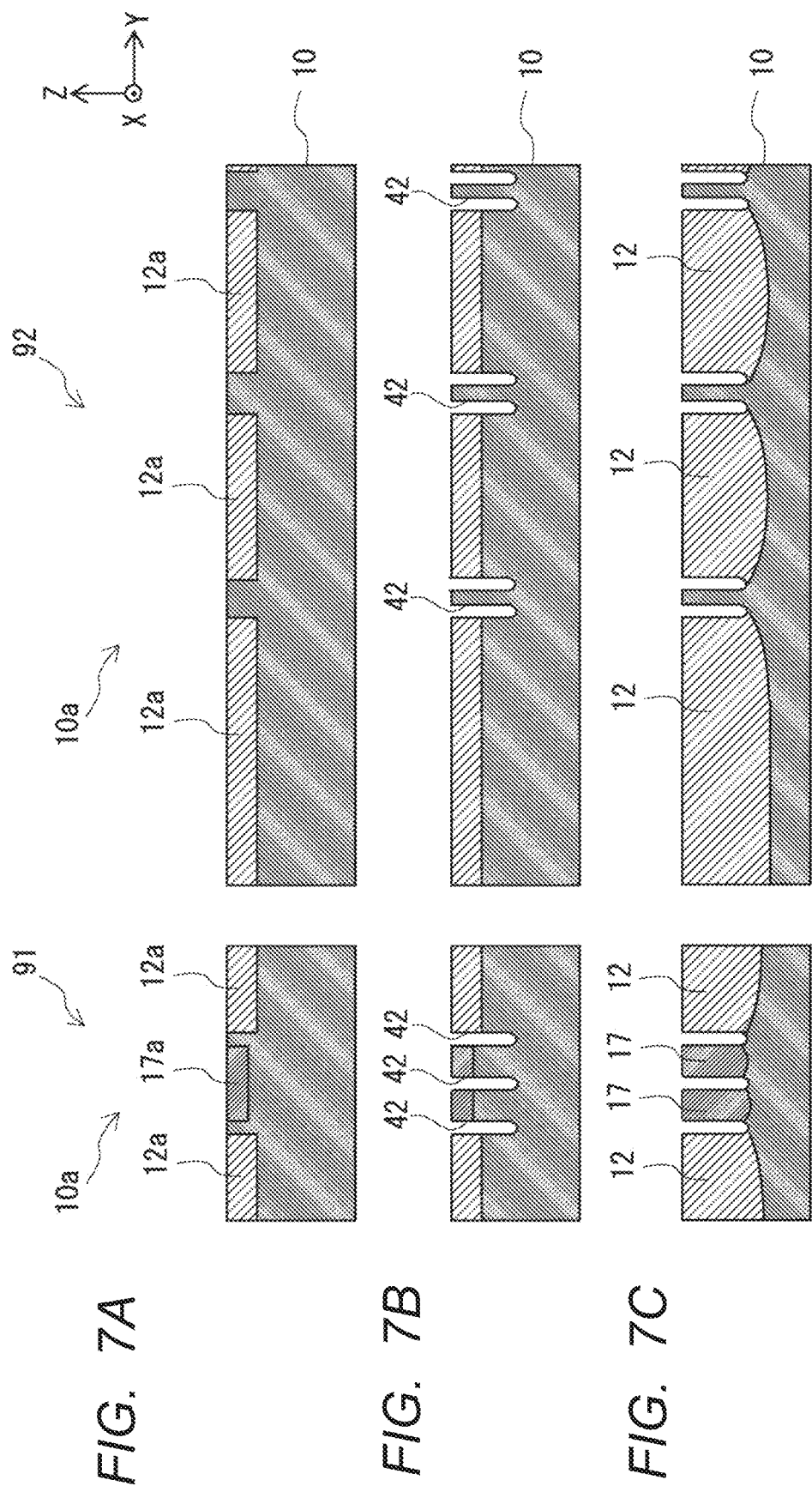

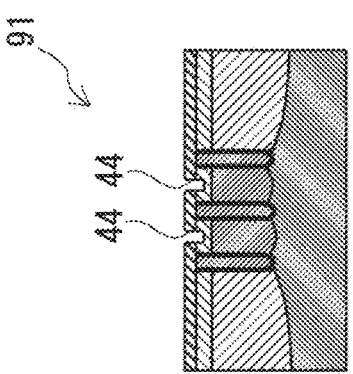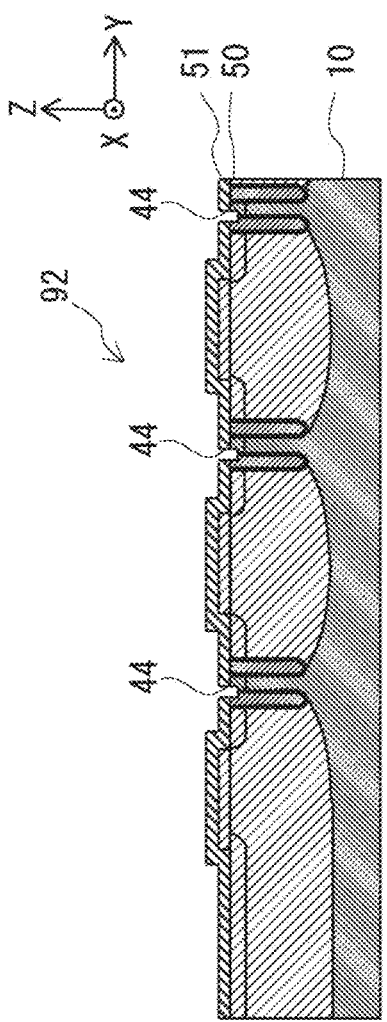
FIG. 9A
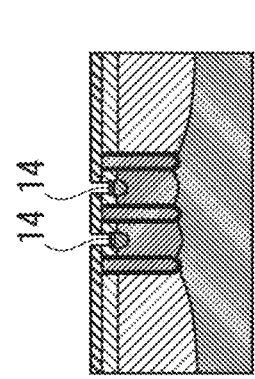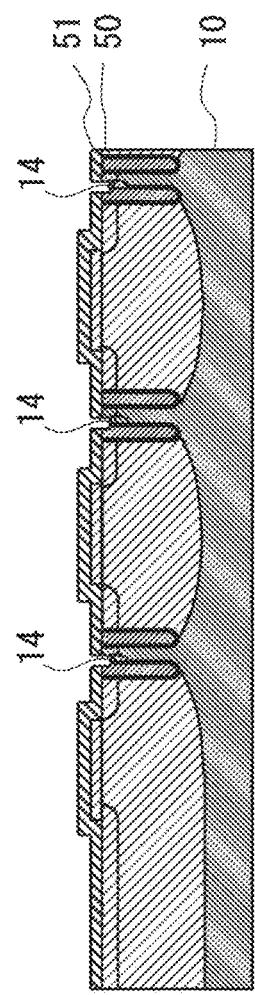
FIG. 9B
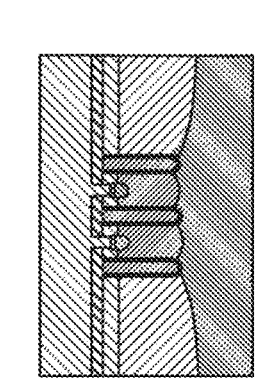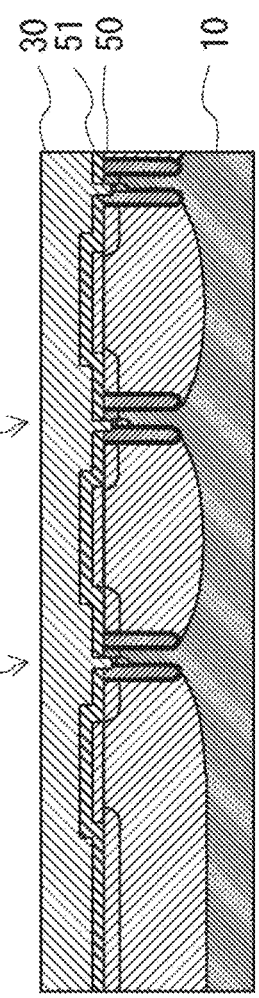
FIG. 9C

SEMICONDUCTOR DEVICE AND METHOD OF MANUFACTURING THE SAME

CROSS-REFERENCE TO RELATED APPLICATIONS

The disclosure of Japanese Patent Application No. 2018-229561 filed on Dec. 7, 2018 including the specification, drawings and abstract is incorporated herein by reference in its entirety.

BACKGROUND

The present invention relates to a semiconductor device and a method of manufacturing a semiconductor device, and, for example, to a semiconductor device including a transistor to which a gate resistance is connected and a method of manufacturing a semiconductor device.

A semiconductor module handling large power is generally configured by multiple parallel connections in which a plurality of semiconductor chips are connected in parallel. This makes it possible to configure an inverter system or the like that handles a large current. In such a multi-parallel-connected semiconductor module, a gate resistance is incorporated in a semiconductor chip as a damping resistance or suppression of an unbalance operation between semiconductor chips.

SUMMARY

Japanese unexamined Patent Application publication No. 2003-197914 discloses that a gate resistance is formed in a gate pad region to suppress an increase in chip size. However, since the contact is formed under the gate pad, there is a fear that the influence on the wire bonding property is caused by the influence of the step in this portion. In addition, the size of the gate resistance needs to be equal to or smaller than the gate pad region, and the design of the gate resistance is limited. Further, since a capacitance due to the oxide film formed under the gate resistance is connected in parallel with the gate resistance, an influence of the capacitance on the resistance value of the gate resistance cannot be eliminated.

Other problems and novel features will become apparent from the description of this specification and the accompanying drawings.

According to one embodiment, a semiconductor device comprises a gate resistance provided on a main surface of a semiconductor substrate, a first and a second contact extending in a first direction extending along a plane parallel to the main surface and contacting with an upper surface of the gate resistance at an a distance along a second direction orthogonal to the first direction, and a carrier discharging portion formed in the semiconductor substrate below the gate resistance and configured to discharge a carrier. The gate resistance comprises a first contacting portion extending in the first direction, a second contacting portion extending in the first direction and contacting with the second contact, and a plurality of extending portions extending in the second direction and contacting with the first contacting portion at one end of the extending portions and contacting with the second contacting portion at another end of the extending portions. The gate resistance has an opening formed between adjacent extending portions, and connected to a gate electrode of a transistor via the first contact or the second contact, and the carrier discharging portion is formed in the opening.

According to the above embodiment, it is possible to provide a semiconductor device and a method of manufacturing the semiconductor device, which can suppress breakdown due to current concentration and an increase in chip size.

BRIEF DESCRIPTION OF THE DRAWINGS

FIGS. 7A, 7B and 7C are process cross-sectional views illustrating a method of manufacturing the semiconductor device according to the first embodiment.

FIGS. 9A, 9B and 9C are a process cross-sectional views illustrating the method of manufacturing the semiconductor device according to the first embodiment.

DETAILED DESCRIPTION

Figure 1A:
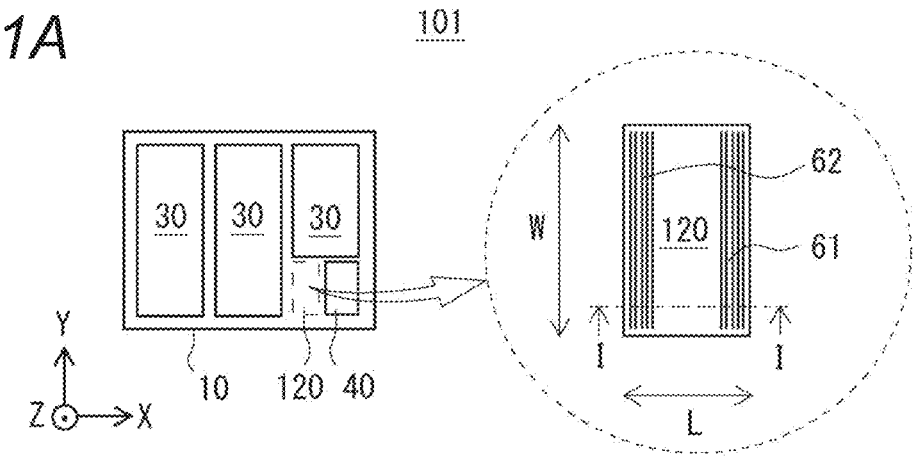
FIG. 1A is a plan view illustrating a semiconductor device according to a comparative example.

For clarity of explanation, the following description and drawings are appropriately omitted and simplified. In the drawings, the same elements are denoted by the same reference numerals, and a repetitive description thereof is omitted as necessary.

Comparative Example

Before describing a semiconductor device according to embodiments, the semiconductor device according to a comparative example will be described. Thereby, the semiconductor device according to the embodiments can be made clearer.

Figure 1B:
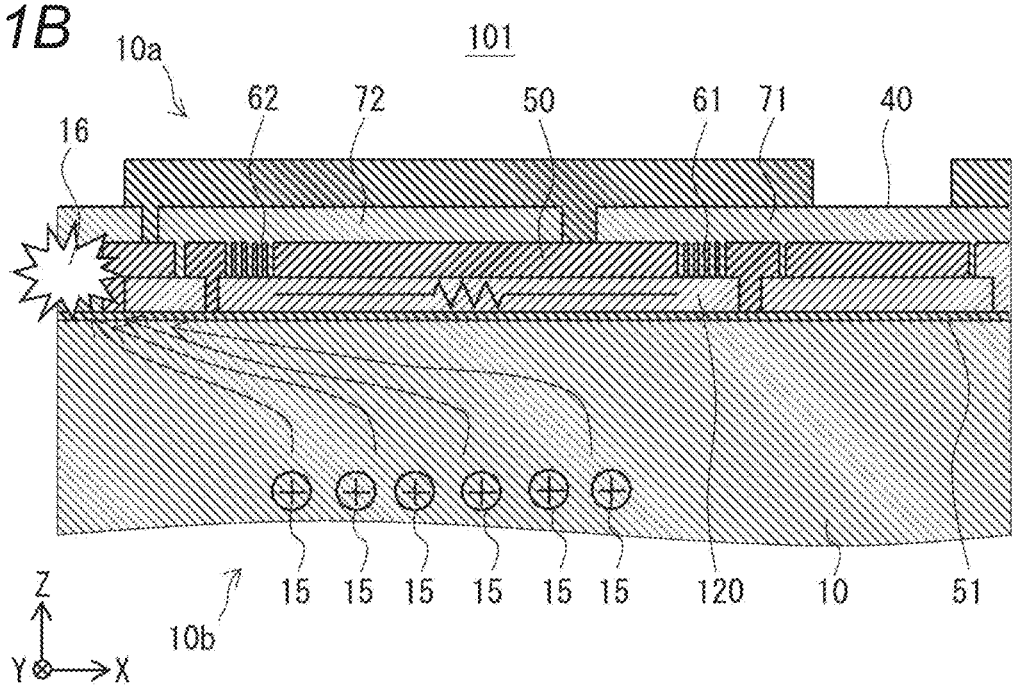
FIG. 1B is a cross-sectional view illustrating the semiconductor device according to the comparative example and shows a cross-section of a I-I line in FIG. 1A.
Figure 1C:
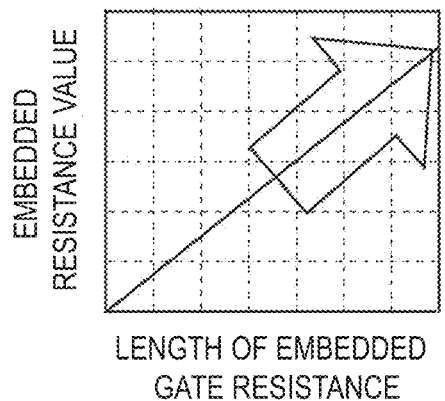
FIG. 1C is a graph illustrating a correlation between a length of the gate resistance embedded in the semiconductor device according to the comparative example and a resistance value, and horizontal axis represents the length of the gate resistance and vertical axis represents the gate resistance value.

FIG. 1A is a plan view exemplifying the semiconductor device according to a comparative example. FIG. 1B is a cross-sectional view exemplifying the semiconductor device according to the comparative example, and shows a cross-section taken along a line I-I in FIG. 1A. FIG. 1C is a graph exemplifying a correlation between a length of a gate resistance and a resistance value incorporated in the semiconductor device according to the comparative example, and horizontal axis shows the length of the gate resistance, and vertical axis shows the gate resistance value.

As shown in FIGS. 1A and 1B, a semiconductor device 101 according to the comparative example is formed in a semiconductor substrate 10. The semiconductor device 101 includes a gate resistance 120, an emitter wiring 30, a gate pad 40, a first contact 61, and a second contact 62. The gate resistance 120, the emitter wiring 30, the gate pad 40, the first contact 61, and the second contact 62 are provided on a main surface 10a of the semiconductor substrate 10. In FIG. 1A, a plurality of emitter wirings 30 are provided. A collector electrode (not shown) is provided on a back surface 10b. The gate resistance 120 is, for example, disposed between the emitter wiring 30 and the gate pad 40 on the main surface 10a of the semiconductor substrate 10. The gate resistance 120 has a rectangular shape having a width W and a length L when viewed from the main surface 10a.

Here, for convenience of description of the semiconductor device 101, an XYZ orthogonal coordinate axis is introduced. A direction perpendicular to the main surface 10a of the semiconductor substrate 10 is defined as a Z-axis direction, a direction from the back surface 10b to the main surface 10a is defined as a +Z-axis direction, and a direction from the main surface 10a to the back surface 10b is defined as a −Z-axis direction. The +Z-axis direction is also referred to as an upward direction, and the −Z-axis direction is also referred to as a downward direction. A plane parallel to the main surface 10a is defined as an XY plane. For example, a direction along the length L of the gate resistance 120 is the X-axis direction, and a direction along the width W of the gate resistance 120 is the Y-axis direction.

The gate resistance 120 includes, for example, polysilicon doped with a predetermined impurity as a material. The gate resistance 120 is covered with an insulating film 50. The insulating film 50 includes, for example, silicon oxide such as PSG and SOG.

The first contact 61 and the second contact 62 are connected to the main surface 10a side of the gate resistance 120. The first contact 61 is, for example, a so-called high-side contact connected to a gate wiring 71 on the gate pad 40 side. The second contact 62 is, for example, a so-called low-side contact connected to a gate wiring 72 on an active cell side. The first contact 61 and the second contact 62 are formed in a portion where the insulating film 50 is removed by etching or the like. On an upper surface of the gate resistance 120, the first contact 61 is connected to a vicinity of an end of the gate resistance in the +X-axis direction. On the upper surface of the gate resistance 120, the second contact 62 is connected to a vicinity of an end in the −X-axis direction.

The first contact 61 and the second contact 62 extend in the Y-axis direction in the XY plane parallel to the main surface 10a. For example, on the upper surface of the gate resistance 120, the first contact 61 and the second contact 62 extend from a vicinity of an end on the −Y-axis direction side to a vicinity of an end on the +Y-axis direction side. Further, the first contact 61 and the second contact 62 are connected to the upper surface of the gate resistance 120 at distance mutually in the X-axis direction. A plurality of first contacts 61 and a plurality of second contacts 62 may be formed. The first contact 61 and the second contact 62 may be formed of a plurality of contacts separated from each other in the X-axis direction. Each contact extends in the Y-axis direction.

The first contact 61 and the second contact 62 are connected to the gates wiring 71 and 72 formed so as to cover the insulating film 50. The gates wiring 71 and 72 are made of, for example, aluminium. Since a current flows between the gate wiring 71 and the gate resistance 72, the gate resistance 120 functions as a resistance.

Figure 2A:
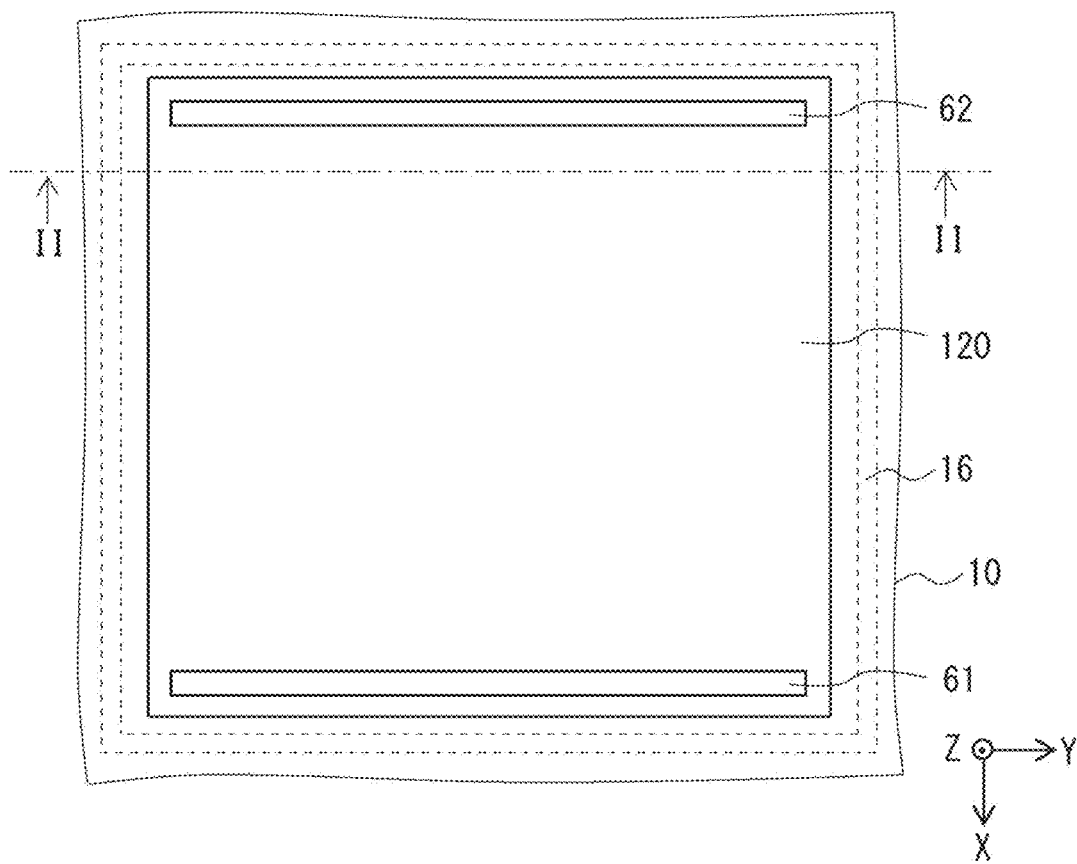
FIG. 2A is a plan view illustrating the gate resistance of the semiconductor device according to the comparative example.
Figure 2B:
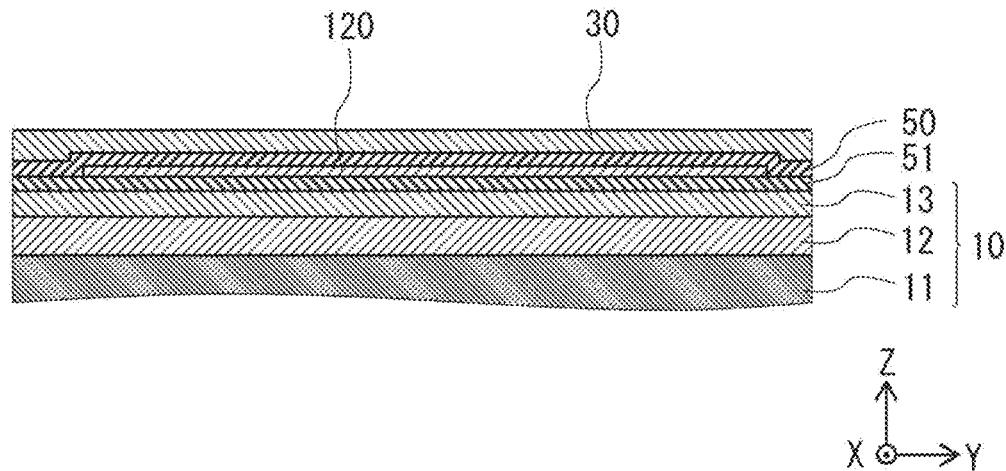
FIG. 2B is a cross-sectional view illustrating the gate resistance of the semiconductor device according to the comparative example, and shows a cross-sectional view of a II-II line in FIG. 2A.

FIG. 2A is a plan view exemplifying the gate resistance of the semiconductor device according to the comparative example, and FIG. 2B is a cross-sectional view exemplifying the gate resistance of the semiconductor device according to the comparative example, and shows a cross-section of a II-II line in FIG. 2A.

As shown in FIGS. 2A and 2B, the gate resistance 120 is rectangular and is formed on the semiconductor substrate 10. FIG. 2A collectively shows the first contact 61 and the second contact 62 formed of the plurality of the contacts. The semiconductor substrate 10 has an n-type drift layer 11, a deep p-type diffusion layer 12 functioning as a well layer, and a shallow p-type diffusion layer 13. In the semiconductor substrate 10, the deep p-type diffusion layer 12 is formed on the n-type drift layer 11, and the shallow p-type diffusion layer 13 is formed on the deep p-type diffusion layer 12. The semiconductor substrate 10 may have other diffusion layer. For example, an n-type field stop layer and a p-type collector layer may be included below the n-type drift layer 11.

An insulating film 51 is formed on the semiconductor substrate 10, and the gate resistance 120 is formed on the insulating film 51. The gate resistance 120 is covered with the insulating film 50. The emitter wiring 30, for example, is formed on the insulating film 50. In the vicinity of the ends of the gate resistance 20 in the +X-axis direction and the −X-axis direction, gate wiring 71 and 72 are formed on the insulating film 50 and connected to the first and second contact 61 and 62 via contact holes formed in the insulating film 50.

Next, two problems relating to the gate resistance 120 according to the comparative example will be described. First problem is that a chip size of the semiconductor device 101 increases. As shown in FIG. 1C, as the length L of the gate resistance 120 increases, the resistance value increases. When the gate resistance 120 is set to a predetermined resistance value, it is necessary to increase the gate resistance 120 to a predetermined length. Therefore, the area on the main surface 10a occupied by the gate resistance 120 becomes large. Thus, it is the first problem to increase the chip size in order to achieve the predetermined resistance value. As the chip size increases, a cost of manufacturing the semiconductor device 1 increases.

Second problem is that carriers 15 such as holes are concentrated in a peripheral region 16 of the gate resistance 120 to cause current concentration. As shown in FIG. 1B, carriers 15 such as holes accumulated under the gate pad 40 are discharged from the peripheral region 16 of the gate resistance 120 at the time of turn-off. Since the gate resistance 120 covers the main surface 10a of the semiconductor substrate 10, the carrier 15 accumulated at a time of conduction is not extracted from a region where the gate resistance 120 is disposed. Thus, the carriers 15 concentrate in the peripheral region 16 of the gate resistance 120 and cause breakdown.

The first and second problems also relate to configurations of the first contact 61 and the second contact 62. From the viewpoint of EMD (Electromigration-Damage), the first contact 61 and the second contact 62 require that a length in the Y-axis direction corresponding to the width W of the gate resistance 120 is about 2000 [μm], and a length in the X-axis direction corresponding to the length L of the gate resistance 120 is about 5 [μm] (in the drawing, 2000 [μm]×1 [μm]×5). Thus, the length of each contact in the Y-axis direction (2000 [μm]) and the length in the X-axis direction also increase the chip size and increase the cost. In addition, the area of the gate resistance 120 for contact is also required, which causes a decrease in breakdown tolerance.

First Embodiment

Figure 3A:
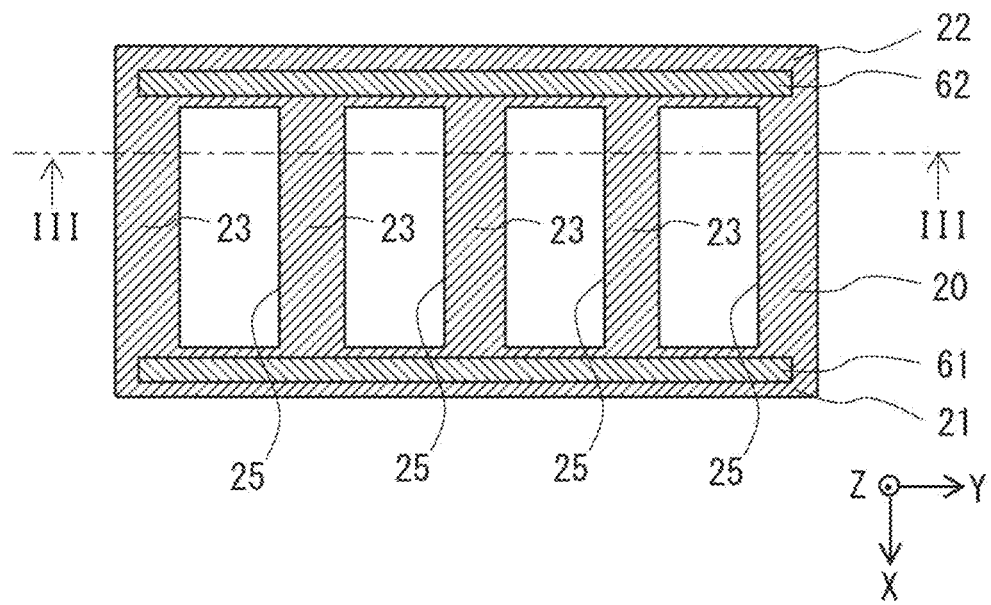
FIG. 3A is a plan view illustrating the gate resistance of the semiconductor device according to a first embodiment.
Figure 3B:
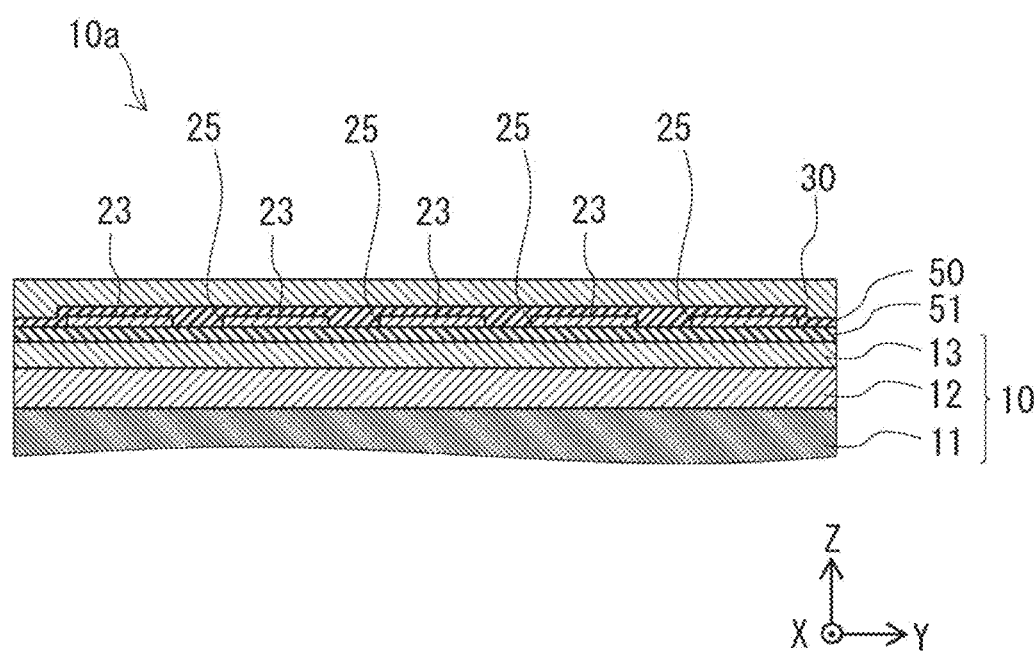
FIG. 3B is a cross-sectional view illustrating the gate resistance of the semiconductor device according to the first embodiment, and shows a cross-sectional view of a III-III line in FIG. 3A.
Figure 4A:
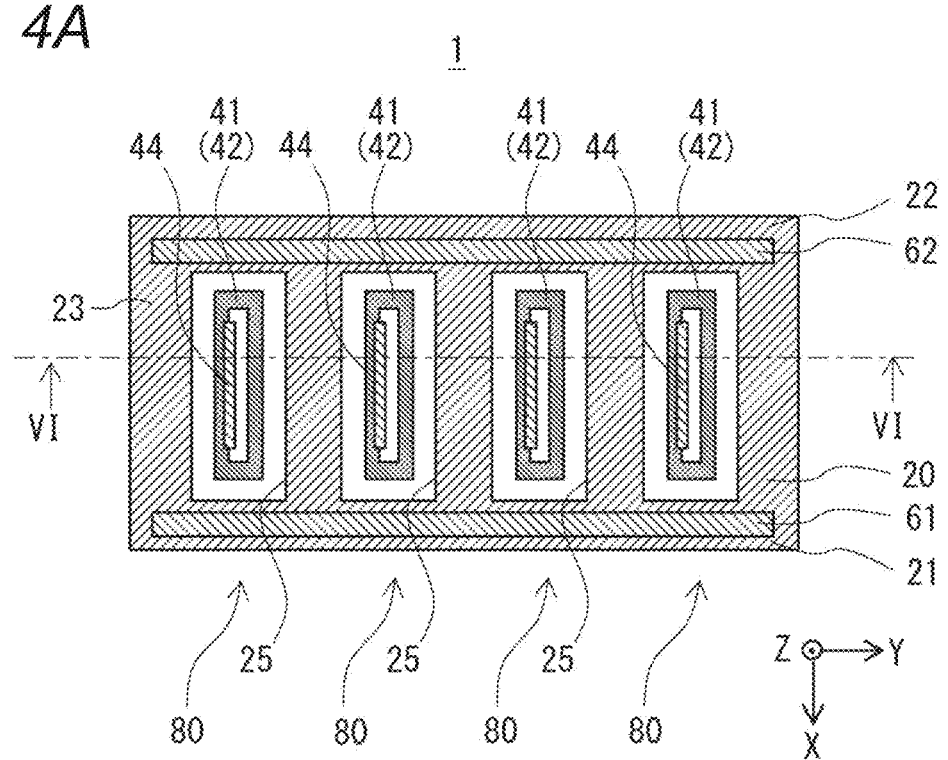
FIG. 4A is a plan view illustrating the semiconductor device according to the first embodiment.
Figure 4B:
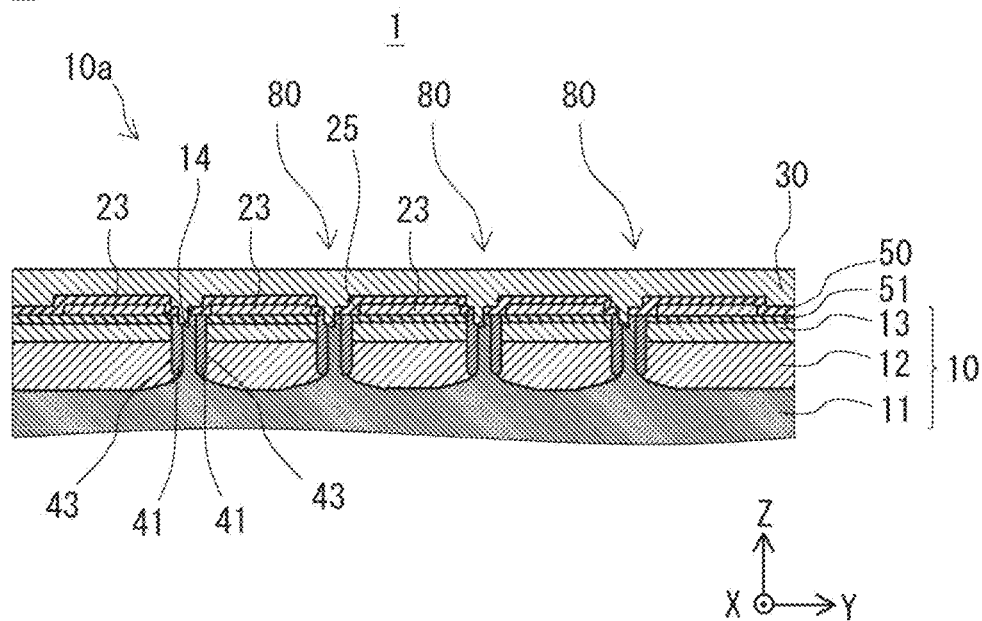
FIG. 4B is a cross-sectional view illustrating the semiconductor device according to the first embodiment, and shows a cross-sectional view of a IV-IV line in FIG. 4A.
Figure 5A:
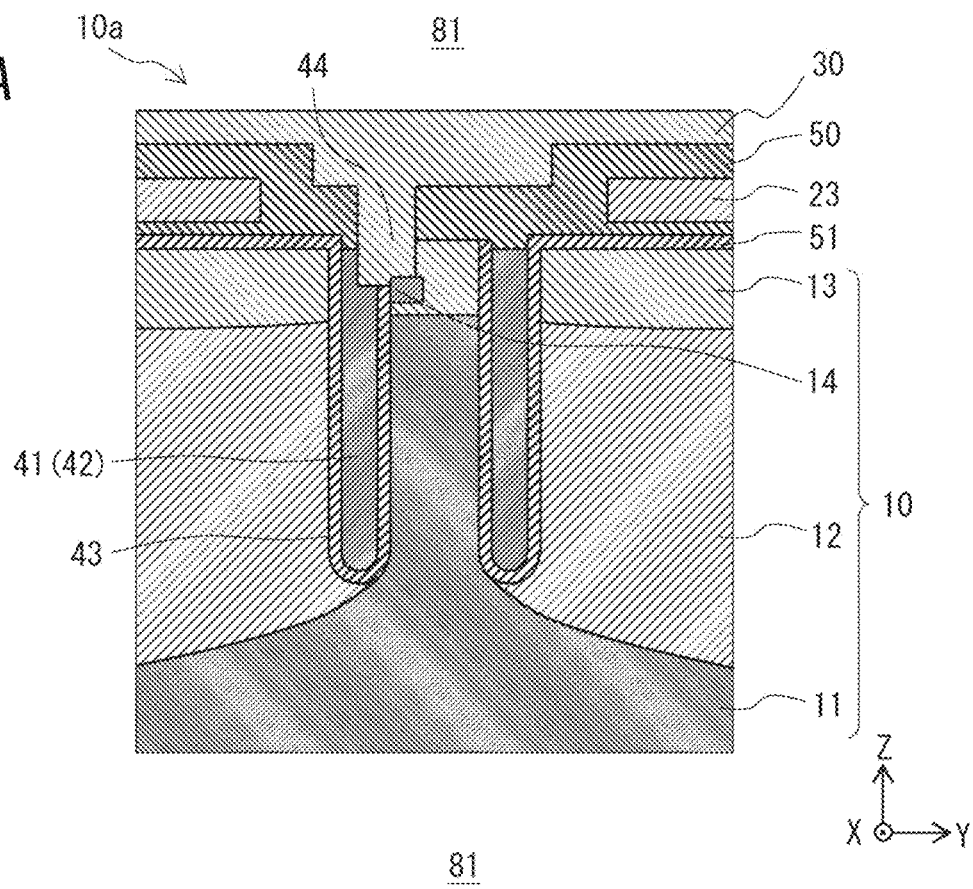
FIG. 5A is a sectional view illustrating a parasitic PMOS of the semiconductor device according to the first embodiment, and shows an enlarged view of FIG. 4B.
Figure 5B:
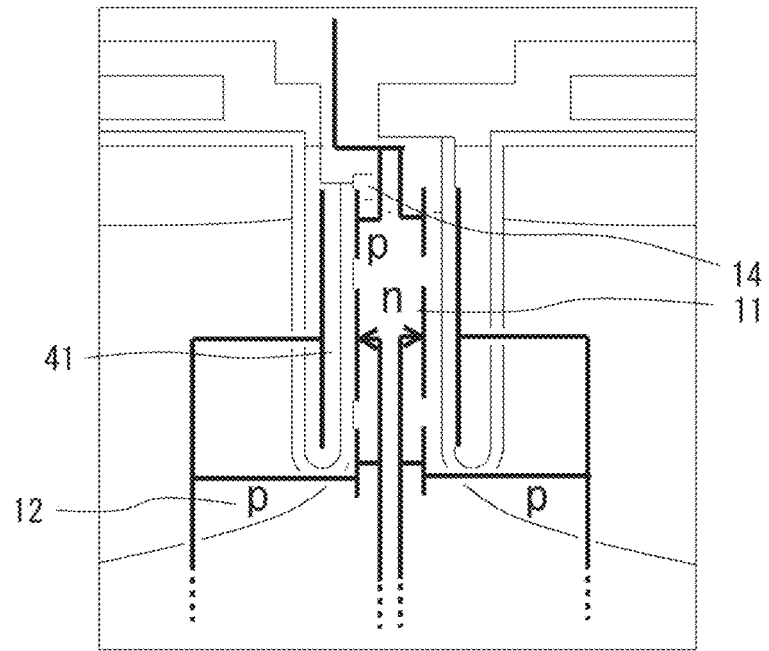
FIG. 5B is a diagram illustrating a connection relationship of a configuration of the parasitic MOS.
Figure 6A:
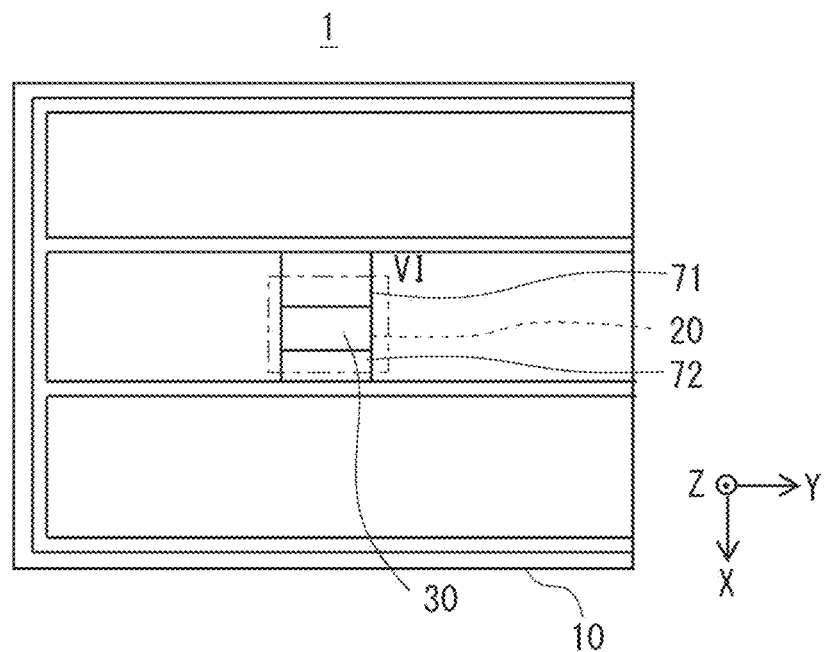
FIG. 6A is a plan views illustrating the semiconductor device according to the first embodiment.
Figure 6B:
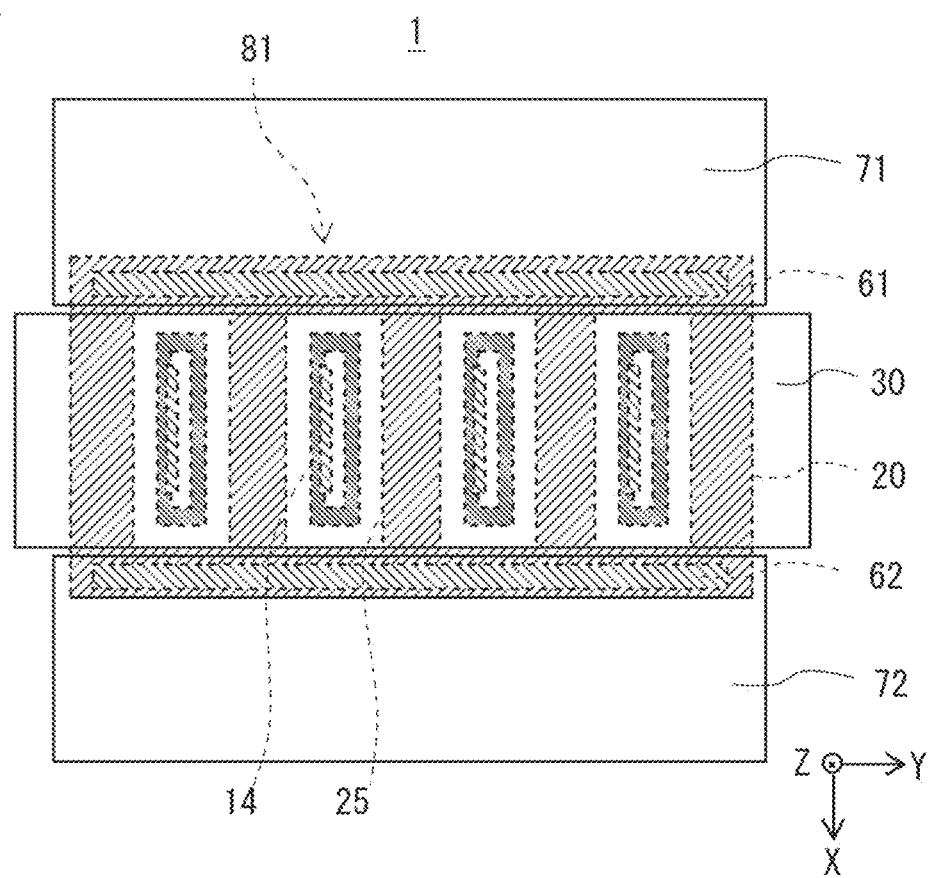
FIG. 6B is a plan views illustrating the semiconductor device according to the first embodiment and an enlarged view of a VI region in FIG. 6A.

Next, the semiconductor device of a first embodiment will be described. FIG. 3A is a plan view exemplifying the gate resistance of the semiconductor device according to the first embodiment, and FIG. 3B is a cross-sectional view exemplifying the gate resistance of the semiconductor device according to the first embodiment, and shows a cross-section of the III-III line of FIG. 3A. FIG. 4A is a plan view exemplifying the semiconductor device according to the first embodiment, and FIG. 4B is a cross-sectional view exemplifying the semiconductor device according to the first embodiment, and shows a cross-section of the IV-IV line of FIG. 4A. FIG. 5A is a cross-sectional view illustrating a parasitic MOS of the semiconductor device according to the first embodiment, and is an enlarged view of FIG. 4B. FIG. 5B is a diagram illustrating a connection relationship of a configuration of the parasitic MOS. FIGS. 6A and 6B are plan views illustrating the semiconductor device according to the first embodiment, and FIG. 6B is an enlarged view of the VI region of FIG. 6A.

As shown in FIGS. 3A and 3B, a gate resistance 20 of the present embodiment is provided on the main surface 10a of the semiconductor substrate 10. In FIG. 3A, the semiconductor substrate 10 is omitted. Note that reference numerals are omitted as appropriate so that the drawings are not complicated. The same applies to the following figures. The gate resistance 20 is in the appearance of a strip, and a plurality of openings 25 are formed. The gate resistance 20 has a shape in which a plurality of openings 25 are thinned out from a rectangular flat conductive film formed of a solid film. Specifically, the gate resistance 20 has a first contacting portion 21 with which the first contact 61 is connected, a second contacting portion 22 with which the second contact 62 is contacted, and a plurality of extending portions 23. The first contacting portion 21 and the second contacting portion 22 extend, for example, in the Y-axis direction. The first contacting portion 21 and the second contacting portion 22 are arranged at a distance in the X-axis direction. The first contact 61 is connected to the upper surface of the first contacting portion 21. The second contact 62 is connected to the upper surface of the second contacting portion 22.

The plurality of the extending portions 23 extend in the X-axis direction. One end of the extending portions 23 is connected to the first contacting portion 21, and the other end of the extending portions 23 is connected to the second contacting portion 22. The extending portion 23 includes a solid film formed on the main surface 10a. The length of each extending portion 23 in the Y-axis direction and the number of extending portions 23 are determined based on a predetermined resistance value of the gate resistance 20. The plurality of extending portions 23 are arranged at a distance in the Y-axis direction between the first contacting portion 21 and the second contacting portion 22. Therefore, in the gate resistance 20, the openings 25 is formed between the adjacent extending portions 23.

As shown in FIG. 3B, the semiconductor substrate 10 includes the n-type drift layer 11, the deep p-type diffusion layer 12 functioning as the well layer, and the shallow p-type diffusion layer 13. In the semiconductor substrate 10, the deep p-type diffusion layer 12 is formed on the n-type drift layer 11, and the shallow p-type diffusion layer 13 is formed on the deep p-type diffusion layer 12. The semiconductor substrate 10 may have other diffused layer. An insulating film 51 is formed on the semiconductor substrate 10, and the extending portions 23, the first contacting portion 21, and the second contacting portion 22 of the gate resistance 20 are formed on the insulating film 51. The gate resistance 20 is covered with the insulating film 50. The emitter wiring 30, for example, is formed on the insulating film 50. Also in the present embodiment, the gate wiring 71 and 72 are formed on the insulating film 50 in the vicinity of the end in the +X-axis direction and in the vicinity of the end in the −X-axis direction of the gate resistance 20, and may be connected to the first contact 61 and the second contact 62 via the contact holes formed in the insulating film 50. Thus, the gate resistance 20 is connected to the gate electrode of the transistor via the first contact 61 or the second contact 62.

Next, a carrier discharging portion 80 of the semiconductor device 1 will be described. As shown in FIGS. 4A and 4B, and FIGS. 5A and 5B, the semiconductor device 1 includes a carrier discharging portion 80 in addition to the gate resistance 20, the first contact 61, and the second contact 62. The carrier discharging portion 80 is a portion for discharging the carrier formed on the semiconductor substrate 10 below the gate resistance 20. The carrier discharging portion 80 is formed in the opening 25. In the present embodiment, the carrier discharging portion 80 is a parasitic MOS 81.

The parasitic MOS 81 includes a trench electrode 41, a trench insulating film 43, the n-type drift layer 11, the deep p-type diffusion layer 12, the shallow p-type diffusion layer 13, a p-type body contact layer 14, and the emitter wiring 30. The parasitic MOS 81 may include other diffusion layers.

The trench electrode 41 is provided in a trench 42 formed in the semiconductor substrate 10. The trench 42 is circularly formed in the semiconductor substrate 10 when viewed from the main surface 10a of the semiconductor substrate 10. The trench electrodes 41 extend from the main surface 10a of the substrate to the n-type drift layer 11. For example, the trench electrodes 41 includes polysilicon doped with a predetermined impurity. In which conductive materials such as polysilicon are buried in the trench 42 is referred to as a trench conductive layer, and which functions as the parasitic MOS 81 and a MOS electrode is referred to the trench electrodes 41. The trench electrode 41 of the parasitic MOS 81 is connected to the emitter wiring 30 and an emitter potential is applied.

The trench insulating film 43 is formed on an inner surface of the trench 42, and is formed between the trench electrodes 41 and the semiconducting substrate 10. The trench insulating film 43 includes, for example, silicon oxide.

In the semiconductor substrate 10, the n-type drift layer 11 is formed in a portion surrounded by the trench electrode 41. The shallow p-type diffusion layer 13 is formed on the n-type drift layer 11 in the semiconductor substrate 10. The p-type body contact layer 14 is formed on the shallow p-type diffusion layer 13 in the semiconductor substrate 10. The deep p-type diffusion layer 12 is formed outside portion of the circular trench electrode 41 in the semiconductor substrate 10. The emitter wiring 30 is connected to the p-type body contact layer 14. The emitter wiring 30 is connected to the p-type body contact layer 14 via a contact opening 44 formed in the semiconductor substrate 10. The emitter wiring 30 is also connected to the trench electrode 41.

As shown in FIG. 5B, the parasitic MOS 81 operates as a parasitic PMOS by combining the trench electrode 41 to which the emitter potential is applied and the deep p-type diffusion layer 12 to be floated. That is, the deep p-type diffusion layer 12 serving as floating becomes a p-type diffusion layer of a p-type channel FET, the n-type drift layer 11 becomes a n-type channel layer, and the p-type body contact layer 14 becomes a p-type diffusion layer of a p-type channel FET. Thus, a pnp MOSFET is formed. At turn-off, holes are generated in a side of the trench electrode 41. Therefore, the deep p-type diffusion layer 12 serving as floating is electrically connected to the p-type body contact layer 14. As a result, a hole discharge path is secured and the holes are discharged.

As shown in FIGS. 6A and 6B, in the semiconductor device 1, the gate wiring 71 of the gate pad 40 side is formed so as to connect to the first contact 61 of the gate resistance 20. As a result, the first contact 61 is connected to the gate pad. On the other hand, the gate wiring 72 of the active cell side is formed so as to be connected to the second contact 62. As a result, the second contact 62 is connected to the active cell.

The emitter wiring 30 is disposed on the semiconductor substrate 10 between the gate wiring 71 and the gate wiring 72. The emitter wiring 30 is formed so as to be connected to the p-body contact layer 14 of the parasitic MOS 81 formed in the openings 25 of the gate resistance 20.

Next, a method of manufacturing the semiconductor device 1 will be described. FIGS. 7A, 7B and 7C, FIGS. 8A, 8B and 8C, and FIGS. 9A, 9B and 9C are process cross-sectional views illustrating a method of manufacturing the semiconductor device according to the first embodiment.

First, as shown in FIG. 7A, an active cell portion 91 and a gate-resistance portion 92 are set on the main surface 10a of the semiconductor substrate 10. For example, the semiconductor substrate 10 includes the active cell portion 91 and the gate resistance portion 92 when viewed from the main surface 10a, and an IGBT is formed in the active cell portion 91 and a gate resistance 20 is formed in the gate resistance portion 92.

In order to form an n-type hole barrier layer, for example, an n-type impurity is introduced into the active cell portion 91 by ion implantation or the like. At the same time, a p-type impurity is introduced into the active cell portion 91 and the gate resistance portion 92 by ion implantation or the like in order to form, for example, the deep p-type diffusion layer 12. As a result, a region 17a including the n-type impurity and a region 12a including the p-type impurity are formed in the semiconductor substrate 10.

Next, as shown in FIG. 7B, the trench 42 is formed so as to separate the region 17a including the n-type impurity and the region 12a including the p-type impurity of the active cell portion 91. At the same time, the trench 42 is formed so as to separate the region 12a including the p-type impurity in the gate resistance portion 92.

Next, as shown in FIG. 7C, the semiconductor substrate 10 is heat-treated to diffuse impurities in each region. As a result, the deep p-type diffusion layer 12 and the n-type hole barrier layer 17 are formed in the active cell portion 91, and the deep p-type diffusion layer 12 is formed in the gate resistance portion 92. In present embodiment, each diffusion layer is separated by the trench 42. Therefore, the diffusion of each impurity is limited to the region separated by the trench 42.

Figures 8A, 8B, 8C:
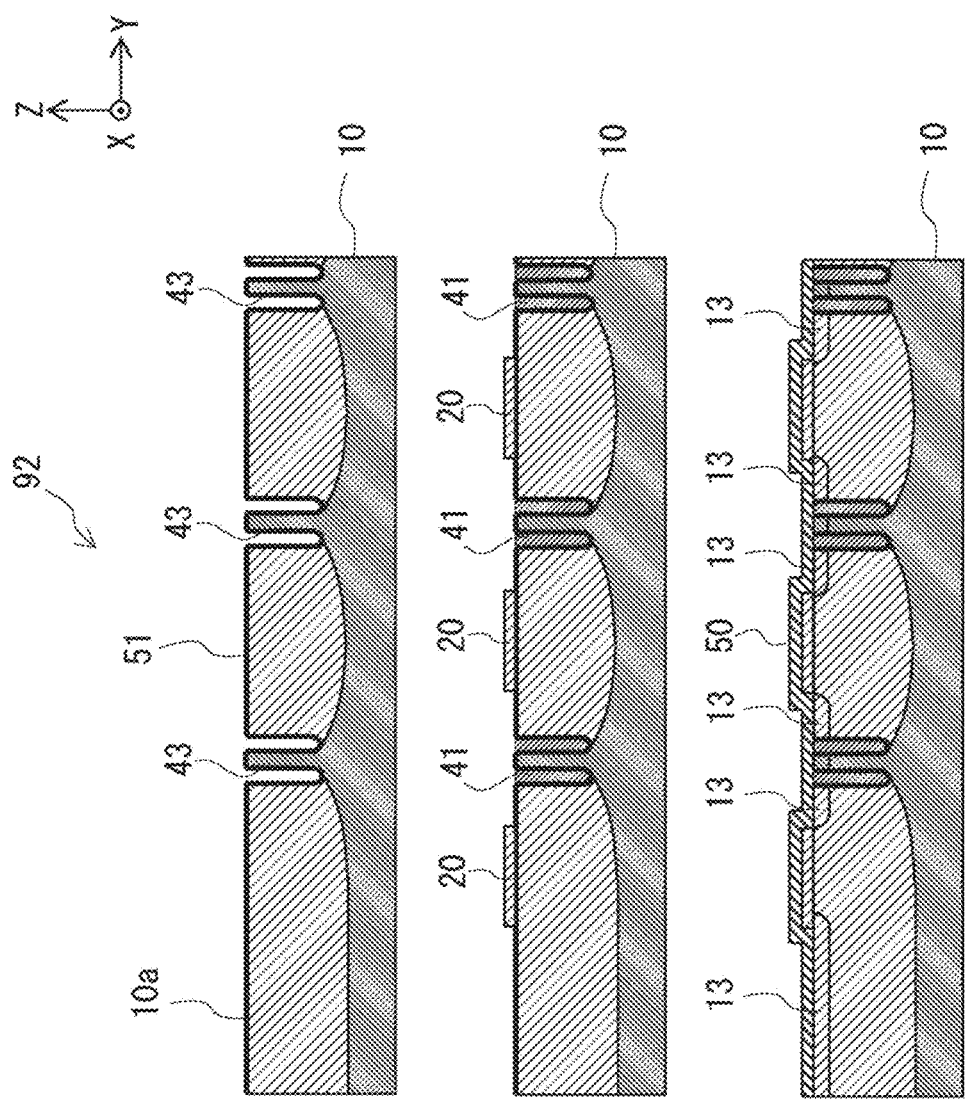
FIGS. 8A, 8B and 8C are a process cross-sectional views illustrating the method of manufacturing the semiconductor device according to the first embodiment.

Next, as shown in FIG. 8A, the insulating film 51 is formed on the main surface 10a of the semiconductor substrate 10 and the inner surface of the trench 42. For example, oxidation treatment is performed to form the insulating film 50. As a result, in the active cell portion 91, a gate dielectric film 45 is formed on the inner surface of the trench 42. In the gate resistance portion 92, the trench insulating film 43 is formed.

Next, as shown in FIG. 8B, a conductive material is deposited on the semiconductor substrate 10 and inside the trench 42. Then, in the active cell portion 91, portions other than the inside of the trench 42 are removed. Thus, the conductive material is embedded in the trench 42 to form the trench electrode 41. The trench electrode 41 of the active cell portion 91 functions as the gate electrode. On the other hand, in the gate resistance portion 92, portions other than the inside of the trench 42 and the gate resistance 20 are removed. As a result, the trench electrode 41 is formed, and the gate resistance 20 is formed from the conductive material on the main surface 10a side. When forming the gate resistance 20, as described above, the first contacting portion 21, the second contacting portion 22 and the plurality of extending portions 23 are provided, and the openings 25 are formed between adjacent extending portions 23.

Next, as shown in FIG. 8C, an impurity is introduced into the semiconductor substrate 10 by ion implantation or the like in order to adjust the impurity concentrations of a channel layer and to form the shallow p-type diffusion layer 13. Then, the insulating film 50 (e.g. PSG, SOG, or the like) is formed on the semiconductor substrate 10.

Next, as shown in FIG. 9A, a contact opening 44 is formed by etching or the like on the insulating films 50 and 51 and the semiconductor substrate 10. Although not shown, an opening for forming the first contact 61 and the second contact 62 is formed in the insulating films 50 and 51 on the gate resistance 20.

Next, as shown in FIG. 9B, an impurity is introduced by ion implantation or the like via the contact opening 44. Thus, the p-type body contact layer 14 is formed.

Next, as shown in FIG. 9C, the emitter wiring 30 of aluminium or the like is formed on the semiconductor substrate 10 so as to connect to the p-type body contact layer 14 through the contact trench 44. Although not shown, gate wirings 71 and 72 made of aluminium or the like are formed on the semiconductor substrate 10 so as to be connected to the gate resistance 20 via openings formed in the insulating films 50 and 51 on the gate resistance 20. Thus, the first contact 61 and the second contact 62 connected to the upper surface of the gate resistance 20 are formed.

In this manner, a predetermined process is performed on the active cell portion 91 to form an IGBT. At the same time, the gate resistance 20 including the carrier discharging portion 80 is formed in the gate resistance portion 92. In this manner, the semiconductor device 1 can be manufactured.

Next, effects of the present embodiment will be described. In the present embodiment, the opening 25 is provided in the gate resistance 20, and the gate resistance 20 is formed into a strip shape. As a result, the resistance value of the gate resistance 20 can be increased. Therefore, the length L between the first contact 61 and the second contact 62 can be reduced, and the area occupied by the gate resistance 20 on the main surface 10a of the semiconductor substrate 10 can be reduced. Therefore, an increase in the chip size can be suppressed.

A parasitic MOS 81 is formed in the opening 25. As a result, carriers such as holes accumulated in the semiconductor substrate 10 below the gate resistance 20 can be effectively discharged through the parasitic MOS 81. Therefore, current concentration in the peripheral region 16 of the gate resistance 20 at a time of turn-off can be suppressed.

Further, since the area occupied by the gate resistance 20 on the main surface 10a can be reduced, the capacitance formed in the semiconductor substrate 10 can be reduced, and the speed-up and the amount of displacement current generated can be suppressed.

In forming the gate resistance 20, it may be formed simultaneously with the manufacturing process of the active cell portion 91. For example, the gate resistance 20 and the trench electrode 41 of the parasitic MOS 81 can be formed at the same time as the trench electrode 41 of the active cell portion 91. In addition, the deep p-type diffusion layer 12, the shallow p-type diffusion layer 13, and the p-type body contact layer 14 in the parasitic MOS 81 can be formed simultaneously with the active cell portion 91. Therefore, an increase in manufacturing cost can be suppressed.

In particular, when the deep p-type diffusion layer 12 is formed, the trench 42 is formed so as to separate the region 12a including the impurity, and thereafter the impurity is diffused. Therefore, since the diffusion of the impurity is limited by the trench 42, a fine diffusion layer can be formed.

Second Embodiment

Figure 10A:
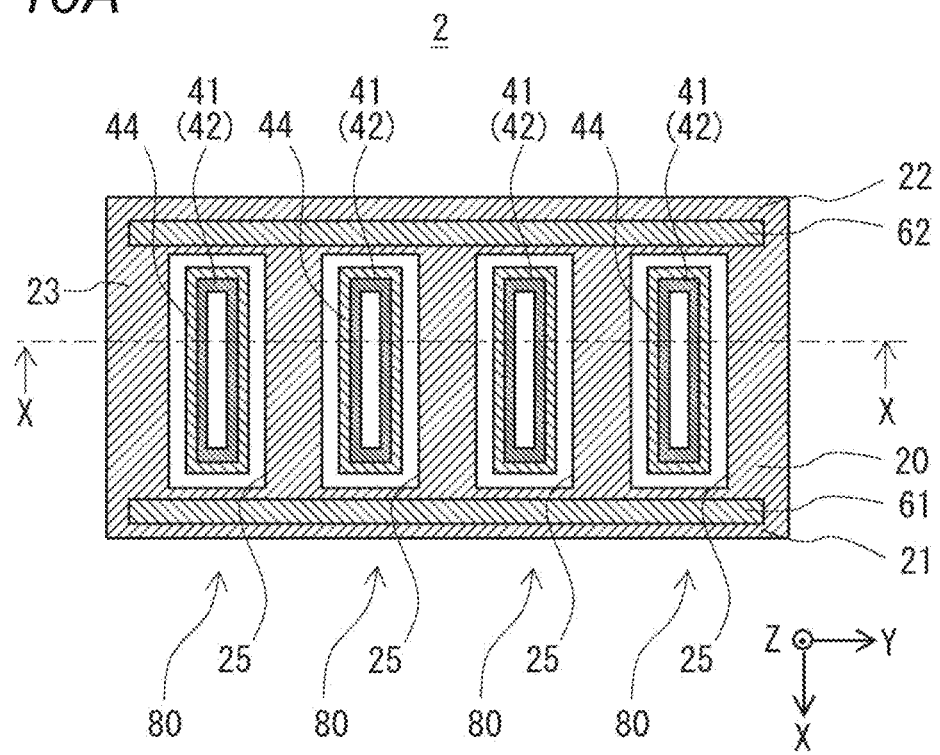
FIG. 10A is a plan view illustrating the semiconductor device according to a second embodiment.

Next, a semiconductor device according to second embodiment will be described. In the semiconductor device of the present embodiment, the emitter wiring 30 is connected to the outer portion of the trench electrode 41 so that floating layer is not formed below the gate resistances 20. FIG. 10A is a plan view exemplifying a semiconductor device according to second embodiment, and FIG. 10B is a cross-sectional view exemplifying a semiconductor device according to second embodiment, and shows a cross-section taken along line X-X in FIG. 10A.

Figure 10B:
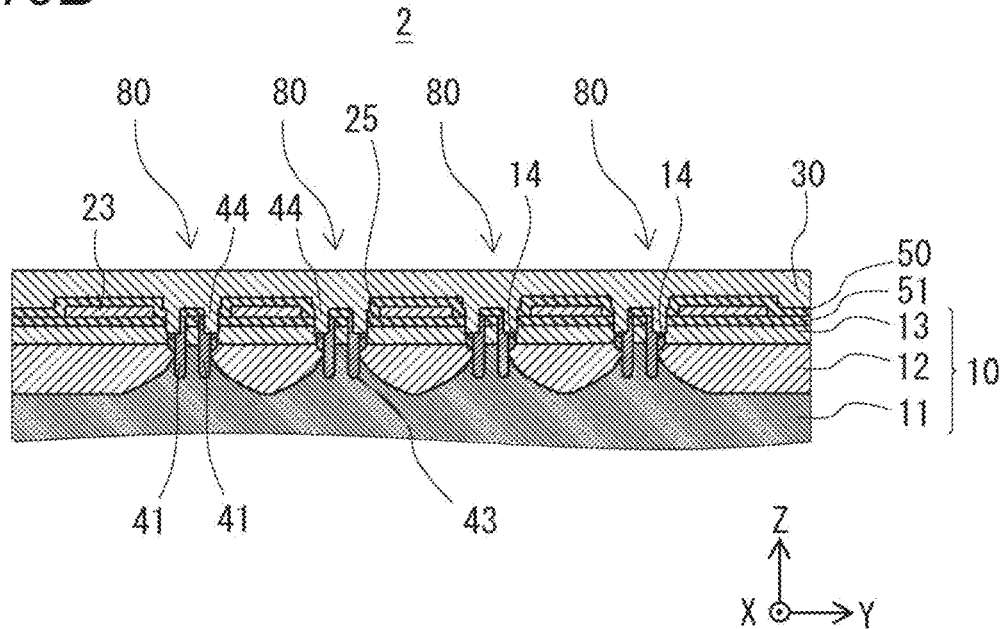
FIG. 10B is a cross-sectional view illustrating the semiconductor device according to the second embodiment, and shows a cross-sectional view of an X-X line in FIG. 10A.

As shown in FIGS. 10A and 10B, also in the present embodiment, a plurality of openings 25 are formed in the gate resistance 20. In the semiconductor device 2 of the present embodiment, the carrier discharging portion 80 formed in the opening 25 is different from that of the first embodiment. That is, the emitter wiring 30 is connected to the deep p-type diffusion layer 12 outside the region surrounded by the trench electrodes 41. Therefore, the deep p-type diffusion layer 12 has a region in which a floating layer is not formed.

Specifically, the carrier discharging portion 80 includes trench electrodes 41, the trench insulating film 43, the n-type drift layer 11, the deep p-type diffusion layer 12, the shallow p-type diffusion layer 13, the diffusion p-type body contact layer 14, and the emitter wiring 30. The trench electrode 41, the trench insulating film 43, the n-type drift layer 11, the deep p-type diffusion layer 12, and the shallow p-type diffusion layer 13 are the same as those in the first embodiment. In the present embodiment, the p-type body contact layer 14 is formed on the deep p-type diffusion layer 12 outside of the circular-shaped trench electrode 41. The emitter wiring 30 is connected to the p-type body contact layer 14 formed on the outside of the circular trench electrode 41. For example, the emitter wiring 30 is connected to the p-type body contact layer 14 through a circular-shaped contact trench 44 formed along the outside of the trench electrode 41.

In the carrier discharging portion 80 of the present embodiment, the discharge path of the carrier 15 is not inside surrounded by the circular trench electrode 41, but outside the circular trench electrode 41. Therefore, the carrier 15 is directly discharged from the semiconductor substrate 10 below the gate resistance 20. Therefore, the deep p-type diffusion layer 12 has a region in which a floating layer is not formed.

According to the semiconductor device 2 of the present embodiment, the deep p-type diffusion layer 12 under the gate resistance 29 is connected to the emitter wiring 30. Therefore, the carriers 15 formed in the substrate 10 below the gate resistance 20 can be directly discharged from the deep p-type diffusion layer 12 to the emitter wiring 30. Therefore, the discharge effect of the carrier 15 can be improved. The formation of the carrier discharging portion 80 of the second embodiment can also be formed simultaneously with the manufacture of the active cell portion 91, such as the IGBT, as in the first embodiment. Other forms and effects are included in the description of the first embodiment.

Third Embodiment

Figure 11A:
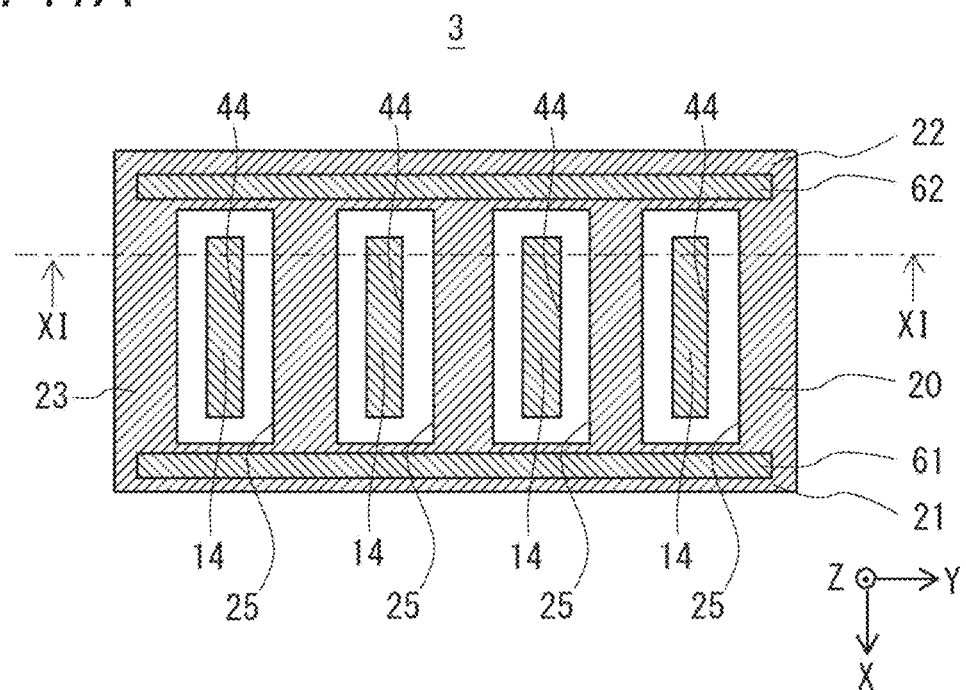
FIG. 11A is a plan view illustrating the semiconductor device according to a third embodiment.

Next, a semiconductor device according to a third embodiment will be described. In the semiconductor device of the present embodiment, only the p-body contact layer 14 is formed without forming a parasitic MOS 81 in the opening 25. FIG. 11A is a plan view exemplifying a semiconductor device according to the third embodiment, and FIG. 11B is a cross-sectional view exemplifying a semiconductor device according to the third embodiment, and shows a cross-section of a XI-XI line in FIG. 11A.

Figure 11B:
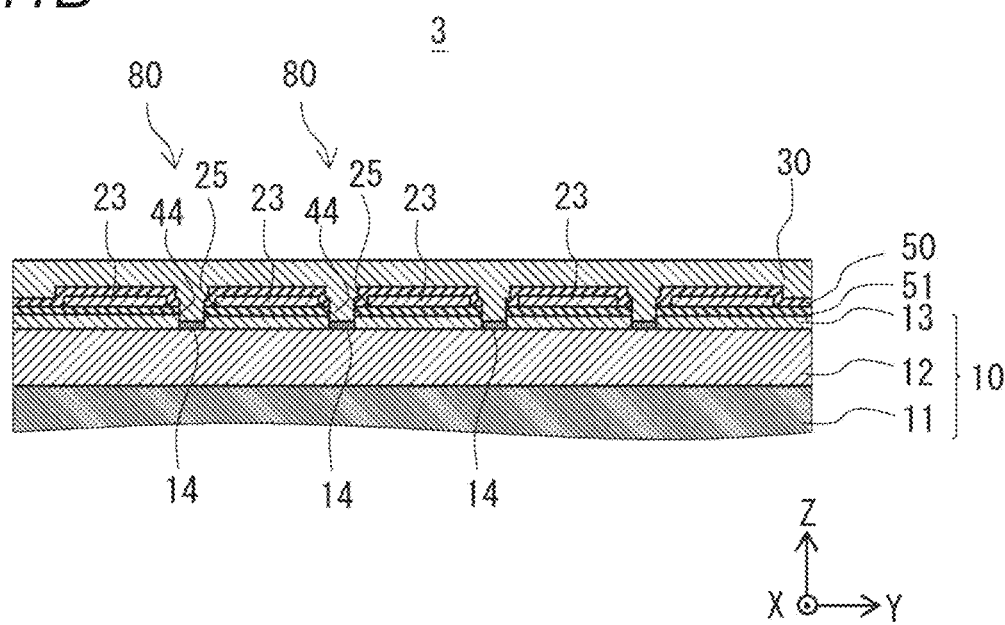
FIG. 11B is a cross-sectional view illustrating the semiconductor device according to the third embodiment and shows a cross-sectional view of a XI-XI line in FIG. 11A.

As shown in FIGS. 11A and 11B, in a semiconductor device 3 of the present embodiment, a plurality of openings 25 are formed in the gate resistance 20. In the semiconductor device 3 of the present embodiment, the carrier discharging portion 80 formed in the opening 25 is the p-type body contact layer 14.

Specifically, the carrier discharging portion 80 includes the n-type drift layer 11, the deep p-type diffusion layer 12, the shallow p-type diffusion layer 13, the p-type body contact layer 14, and the emitter wiring 30. The n-type drift layer 11 is formed on the semiconductor substrate 10. The deep p-type diffusion layer 12 is formed on the n-type drift layer 11. The p-type body contact layer 14 is formed on the deep p-type diffusion layer 12. The emitter wiring 30 is connected to the p-type body contact layer 14. For example, the emitter wiring 30 is connected to the p-type body contact layer 14 through a contact trench 44 formed in the semiconductor substrate 10.

In the semiconductor device of the present embodiment, the trench electrode 41 is not formed in the opening 25. Therefore, it is possible to cope with the planar type IGBT. That is, the gate resistance 92 can be manufactured together with the planar IGBT by using the manufacturing process of the planar IGBT. Other forms and effects are included in the description of the first and second embodiments.

Fourth Embodiment

Figure 12A:
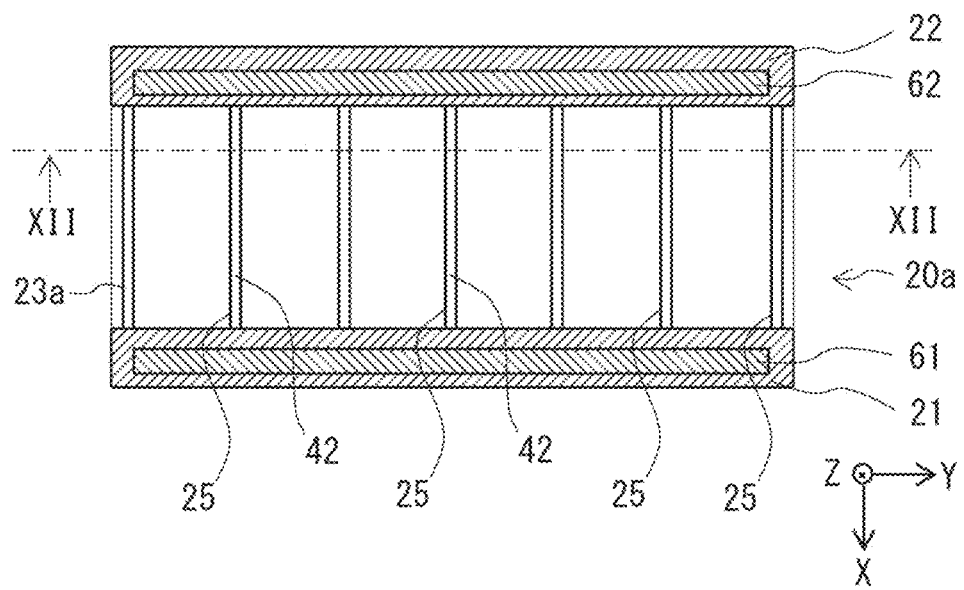
FIG. 12A is a plan view illustrating the gate resistance of the semiconductor device according to a fourth embodiment.
Figure 12B:
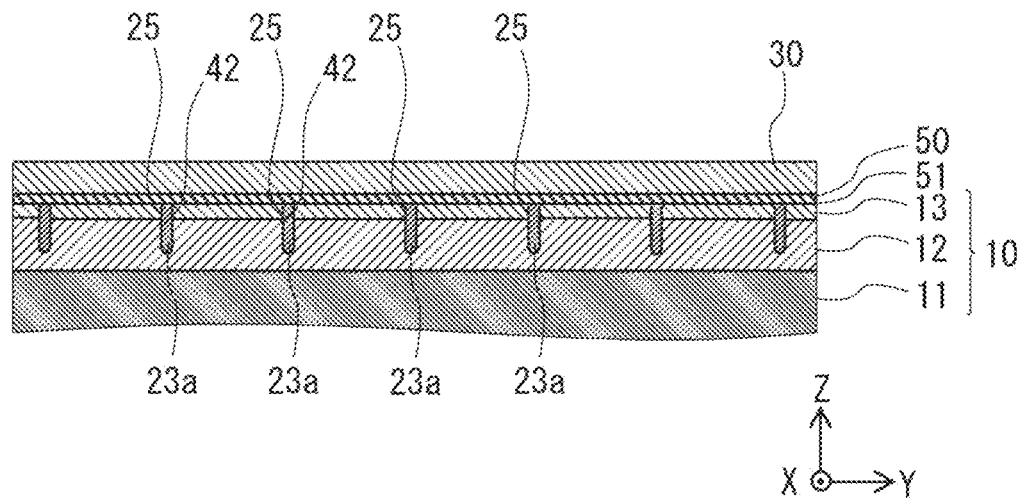
FIG. 12B is a cross-sectional view illustrating the gate resistance of the semiconductor device according to the fourth embodiment and shows a cross-sectional view of a XII-XII line in FIG. 12A.
Figure 13A:
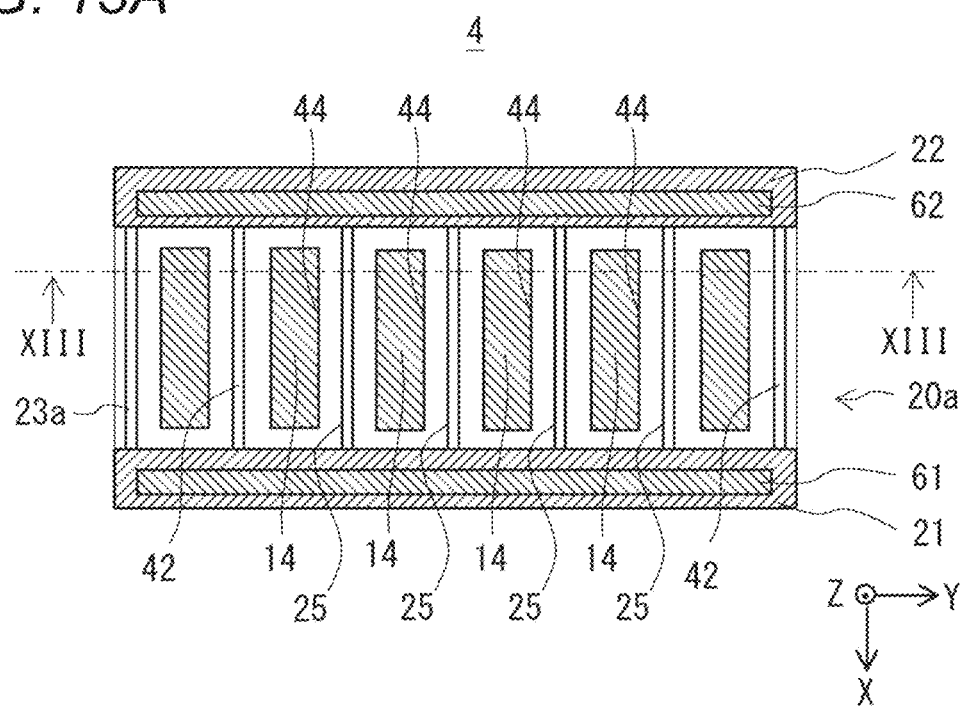
FIG. 13A is a plan view illustrating the semiconductor device according to the fourth embodiment.
Figure 13B:
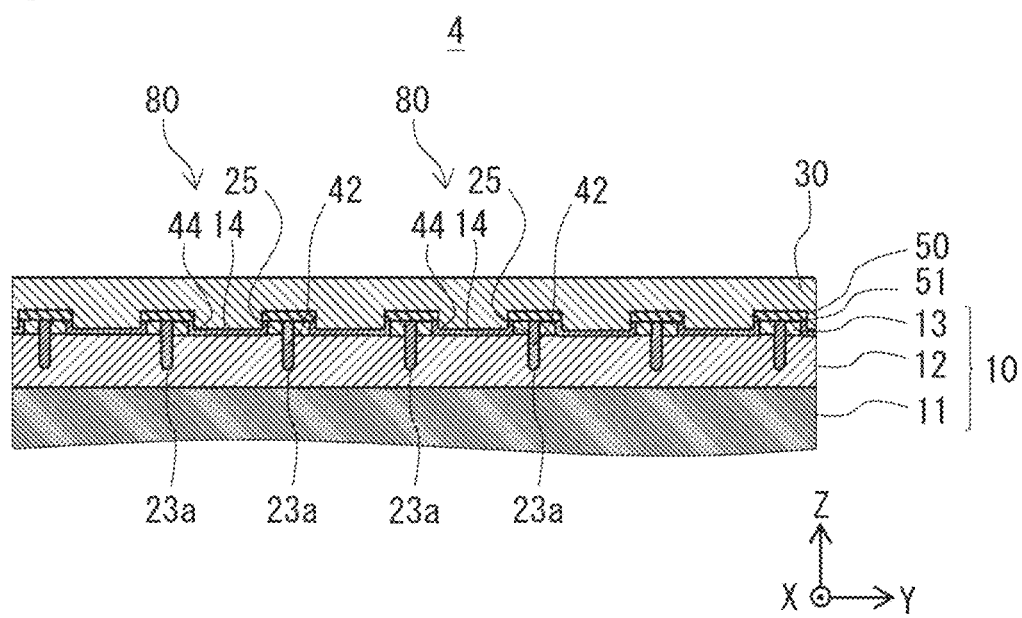
FIG. 13B is a cross-sectional view illustrating the semiconductor device according to the fourth embodiment and shows a cross-sectional view of a XIII-XIII line in FIG. 13A.

Next, a semiconductor device according to fourth embodiment will be described. In the gate resistance in the semiconductor device of the present embodiment, the extending portion is formed inside the trench 42. FIG. 12A is a plan view illustrating the gate resistance of a semiconductor device according to the fourth embodiment, and FIG. 12B is a cross-sectional view illustrating the gate resistance of a semiconductor device according to the fourth embodiment, and shows a cross-sectional view of a XII-XII line according to FIG. 12A. FIG. 13A is a plan view exemplifying a semiconductor device according to the fourth embodiment, and FIG. 13B is a cross-sectional view exemplifying a semiconductor device according to the fourth embodiment, and shows a cross-section of a XIII-XIII line in FIG. 13A.

As shown in FIGS. 12A and 12B, a gate resistance 20a of present embodiment has an extending portion 23a formed within the trench 42. The extending portion 23a includes a trench conductive layer provided inside the trench 42. The opening 25 is formed between the adjacent extending portions 23a. As shown in FIGS. 13A and 13B, in the semiconductor device 4 of present embodiment, the carrier discharging portion 80 formed in the opening 25 is a p-type body contact layer 14. Therefore, present embodiment is the same as the third embodiment.

In the above-described first, second and third embodiments, the extending portion 23 of the gate resistance 20 is a planar type and is formed as a beta film on the main surface 10a of the semiconductor substrate 10. On the other hand, in the present embodiment, the extending portion 23a of the gate resistance 20a is formed by embedding a conductive material such as polysilicon in the trench 42. In this manner, by forming the gate resistance 20a inside the trench 42, the adjustment range of the resistance value of the gate resistance 20a can be expanded. For example, the adjustment range can be extended from a small resistance value to a large resistance value. When the gate resistance 20a is designed, the distance between the extending portions 23a adjacent to each other in the Y-axis direction can be determined based on a predetermined resistance value of the gate resistance 20a.

An opening 25 is formed between the extending portions 23a formed inside the trench 42. The discharge of the carrier 15 can be adjusted by adjusting the pitch of the contact opening 44 in the opening 25.

The extension portion 23a of the present embodiment can be formed at the same time when the trench electrode 41 is formed. Therefore, an increase in manufacturing cost can be suppressed. Other forms and effects are included in the description of the first, second and third embodiments.

Fifth Embodiment

Figure 14A:
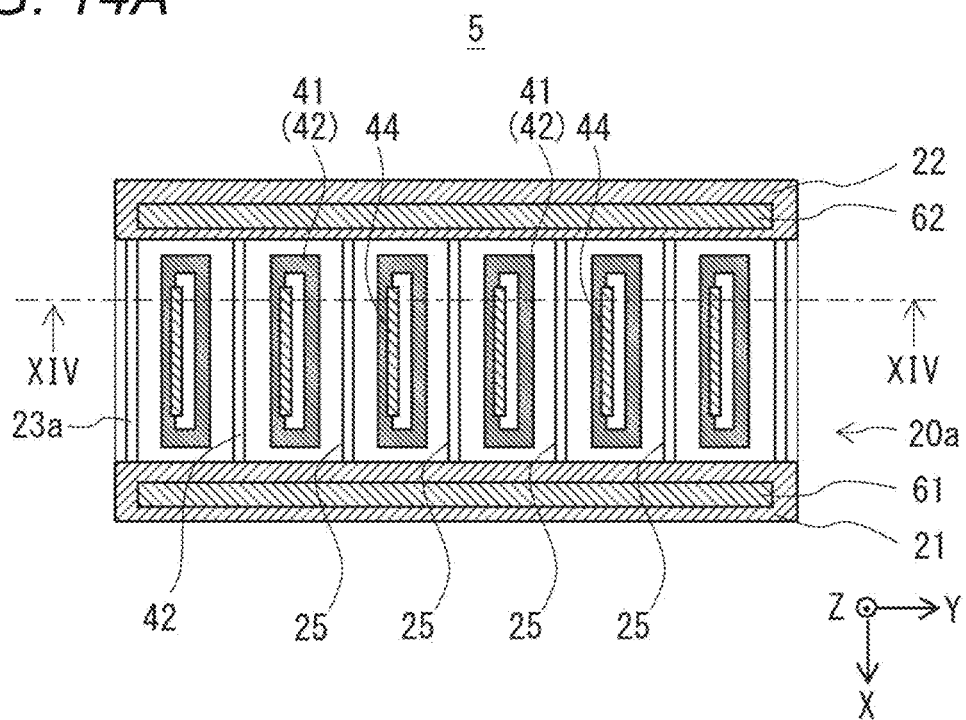
FIG. 14A is a plan view illustrating the semiconductor device according to a fifth embodiment.

Next, a semiconductor device according to fifth embodiment will be described. In the gate resistance 20a in the semiconductor device of the present embodiment, the extending portion 23a is formed inside the trench 42. A parasitic MOS 81 is formed in the opening 25. FIG. 14A is a plan view illustrating a semiconductor device according to the fifth embodiment, and FIG. 14B is a cross-sectional view illustrating a semiconductor device according to the fifth embodiment, and shows a cross-sectional view of a XIV-XIV line according to FIG. 14A.

Figure 14B:
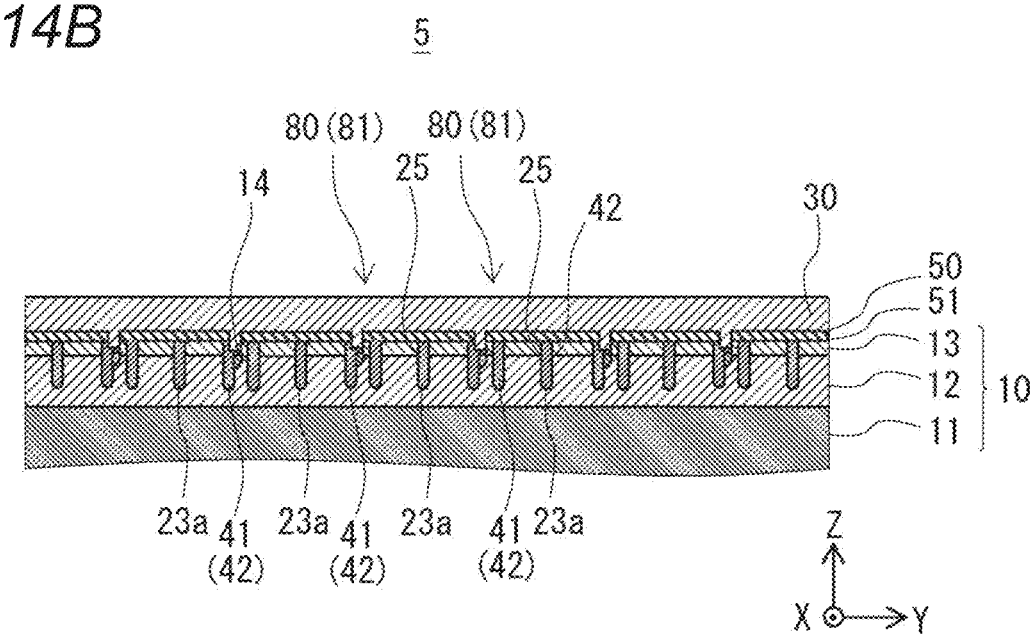
FIG. 14B is a cross-sectional view illustrating the semiconductor device according to the fifth embodiment and shows a cross-sectional view of a XIV-XIV line in FIG. 14A.

As shown in FIGS. 14A and 14B, the gate resistance 20a of the semiconductor device 5 of present embodiment has an extending portion 23a formed within the trench. The parasitic MOS 81 is formed in the opening 25. Therefore, the configuration of the gate resistance 20a is the same as that of the fourth embodiment. The configuration of carrier discharging portion 80 is the same as that of the first embodiment.

Figure 15A:
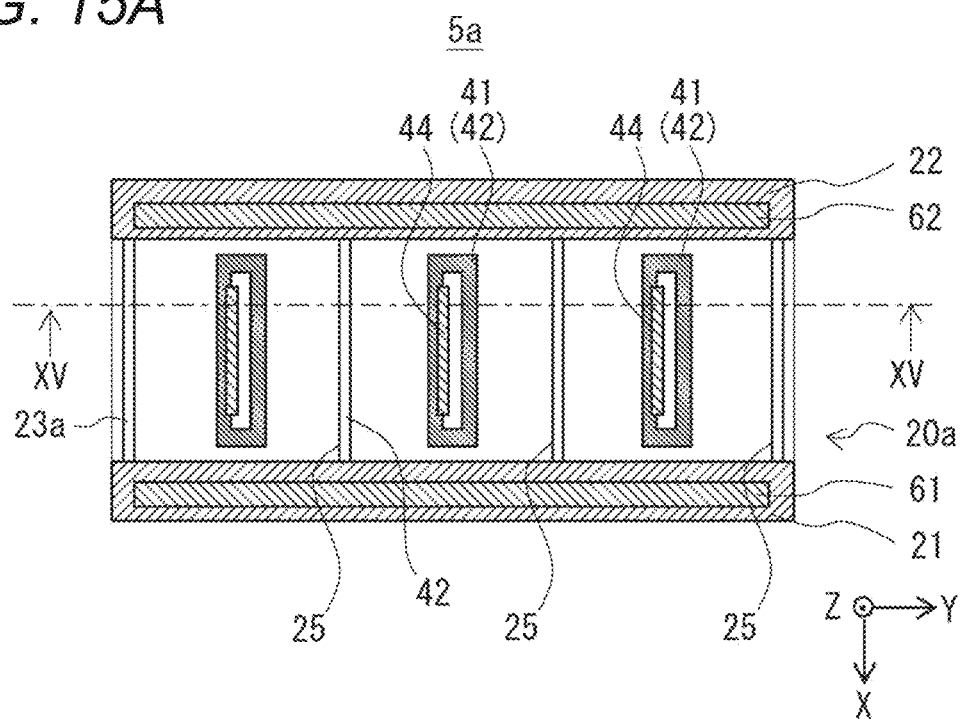
FIG. 15A is a plan view illustrating the semiconductor device according to another example of the fifth embodiment.
Figure 15B:
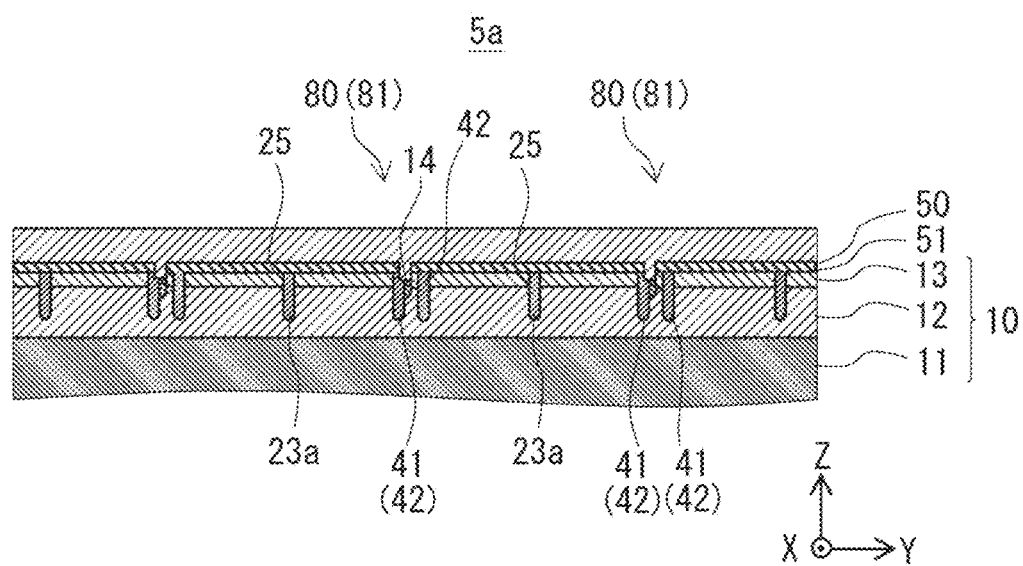
FIG. 15B is a cross-sectional view illustrating the semiconductor device according to another example of the fifth embodiment, and showing a cross-sectional view of a XV-XV line of FIG. 15A.

FIG. 15A is a plan view illustrating a semiconductor device according to another example of the fifth embodiment; and FIG. 15B is a cross-sectional view illustrating a semiconductor device according to another example of the fifth embodiment, and shows a cross-section of a XV-XV line according to FIG. 15A. As shown in FIGS. 15A and 15B, in a semiconductor device 5a of another embodiment of the fifth embodiment, the extending portion 23a is thinned out as compared with the semiconductor device 5 described above. That is, the interval between the extending portions 23a in the Y-axis direction is widened. In this manner, in the semiconductor device 5a, the resistance of the gate resistance 20a can be adjusted by adjusting the distance between the extending portions 23a. By increasing the distance, the resistance value can be increased. Therefore, when the resistance value of the gate resistance 20a is set to be large, an increase in size can be suppressed.

According to the semiconductor device 5 and the semiconductor device 5a of the present embodiment, it is possible to improve the discharge effects of the carrier 15 and to adjust the resistance of the gate resistance 20a. Other forms and effects are included in the description of the first, second, third and fourth embodiments.

Sixth Embodiment

Next, a semiconductor device according to sixth embodiment will be described. In the semiconductor device 101 of the comparative example shown in FIG. 1, the insulating film 51 is provided to insulate between the gate resistance 120 and the lower p-type diffusion layer. However, the insulating film 51 functions as a capacitor connected in parallel between the gate and the emitter, and changes the resistance value of the gate resistance 20.

Figure 16A:
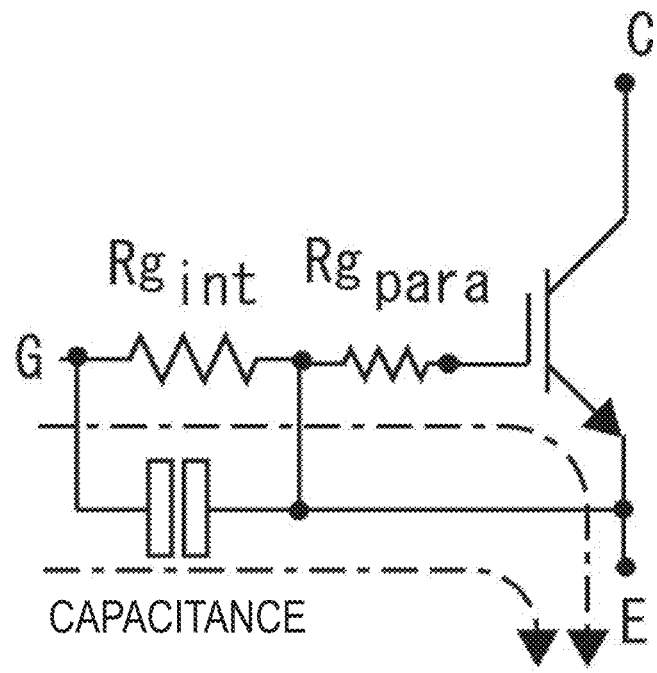
FIG. 16A is a circuit diagram illustrating an equivalent circuit of the semiconductor device according to a comparative example.
Figure 16B:
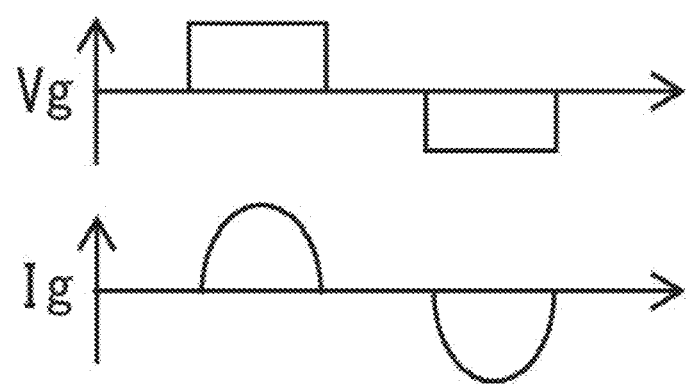
FIG. 16B is a graph illustrating a gate waveform of the semiconductor device according to the comparative example, and horizontal axis indicates time and vertical axis indicates a gate potential and a gate current.

FIG. 16A is a circuit diagram illustrating an equivalent circuit of a semiconductor device according to a comparative example. FIG. 16B is a graph illustrating a gate waveform of a semiconductor device according to a comparative example, and the horizontal axis indicates time, and the vertical axis indicates a gate potential and a gate current. As shown in FIG. 16A, the gate of the semiconductor device 101 is connected to an internal resistance $Rg_{int}$ and a parasitic resistance $Rg_{para}$, and the capacitance of the insulating film 51 is connected in parallel between the gate and the emitter. Here, the inner resistance $Rg_{int}$ means a resistance by the gate resistance 120, and the parasitic resistance $Rg_{para}$ means a parasitic gate resistance.

For example, when a verification experiment is actually performed, it is measured that the capacity is reduced. Capacitance measurements are usually detected in AC (1 MHz). As shown in FIG. 16B, a gate control of the IGBT is PWM-controlled by triangular wave comparison and a pulse waveform, but since the gate is pulled negative, the pulse waveform is a waveform close to AC. If the capacitance is fluctuating, the resistance value changes depending on the switching frequency. The change in impedance Z is given by the following equation:

$$Z=1/(2\pi \times f \times c)$$

Where f represents the switching frequency and c represents the capacitance. Such parasitic capacitances are affected by process variations and cause a difference between semiconductor devices. This causes an imbalance in the operation of the parallel connection. Therefore, stable switching cannot be performed. The present embodiment is to solve such a problem.

Figure 17A:
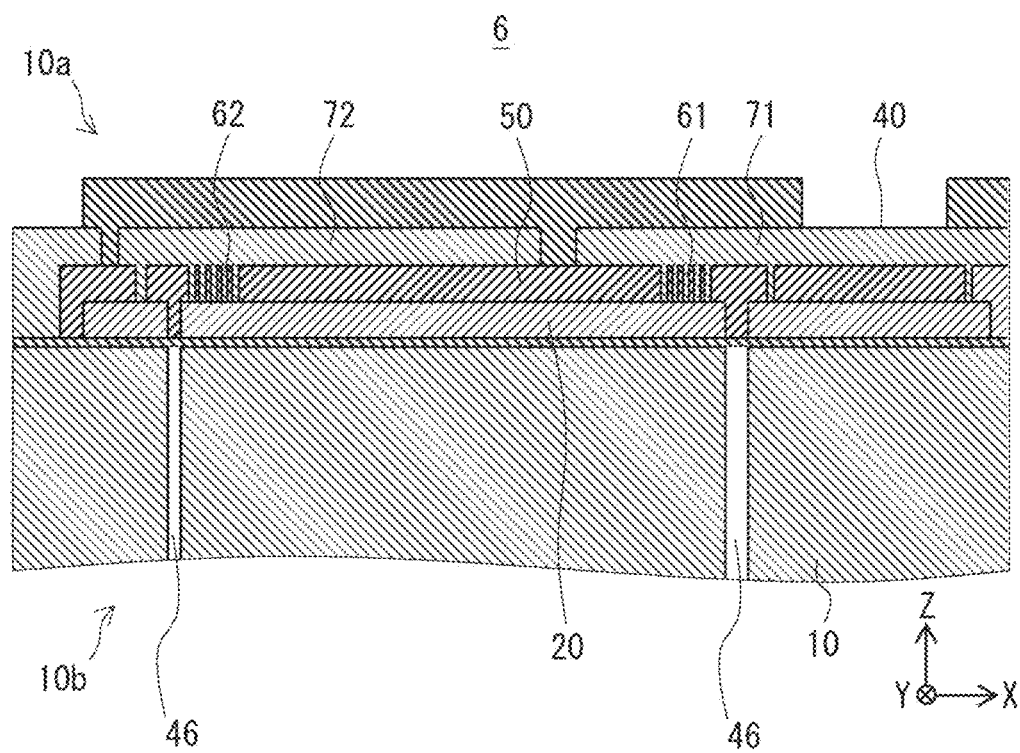
FIG. 17A is a diagram illustrating the semiconductor device according to a sixth embodiment.
Figure 17B:
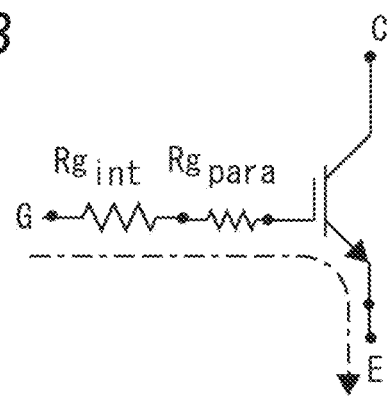
FIG. 17B is a circuit diagram illustrating an equivalent circuit of the semiconductor device according to the sixth embodiment.

Hereinafter, the semiconductor device of the present embodiment will be described with reference to the drawings. FIG. 17A is a diagram illustrating a semiconductor device according to the sixth embodiment, and FIG. 17B is a circuit diagram illustrating an equivalent circuit of the semiconductor device according to the sixth embodiment. As shown in FIG. 17A, in the semiconductor device 6 of the present embodiment, the p-type diffusion layer below the gate resistance 20 is separated by an isolation layer 46 and is floating. That is, it is separated from the surrounding emitter potential layer. Therefore, as shown in FIG. 17B, no capacitance is formed between the gate and the emitter. This makes it possible to suppress the variation of the resistance value of the gate resistance 20, thereby enabling stable switching.

Figure 18A:
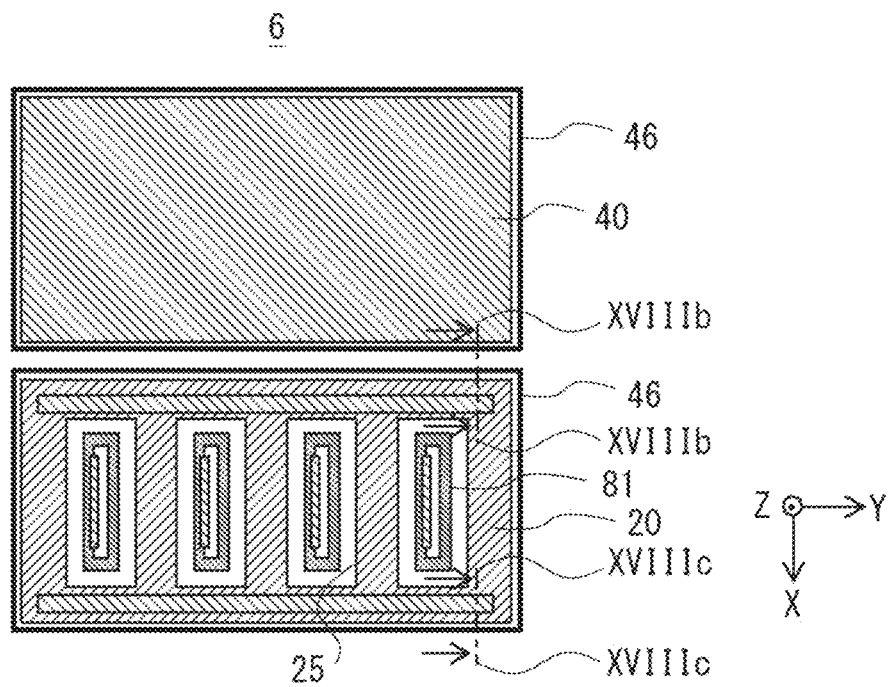
FIG. 18A is a plan view exemplifying the semiconductor device according to the sixth embodiment.
Figure 18B:
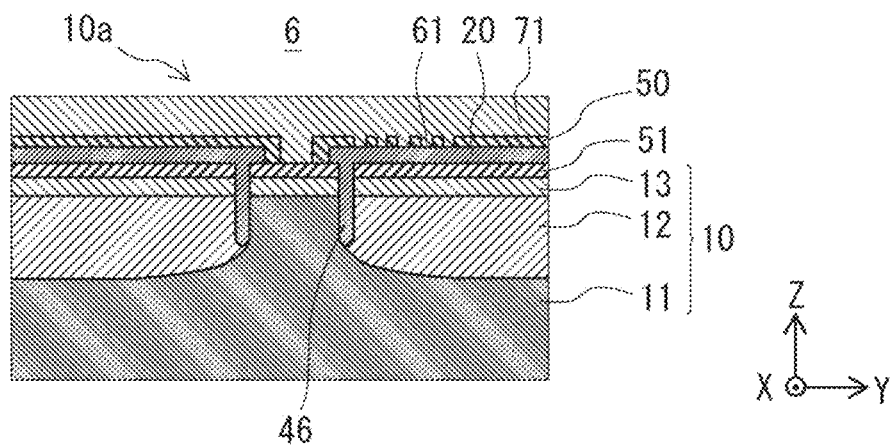
FIG. 18B is cross-sectional view exemplifying the semiconductor device according to the sixth embodiment, and shows a cross-section of a XVIIIb-XVIIIb line in FIG. 18A.
Figure 18C:
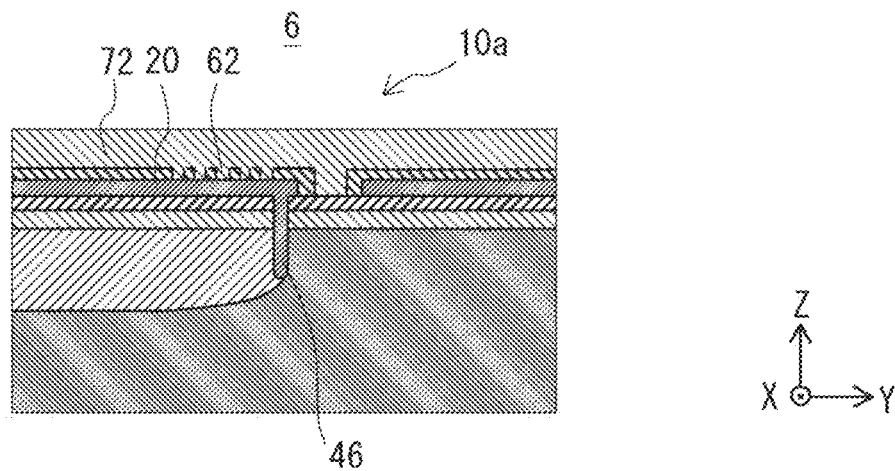
FIG. 18C is cross-sectional view exemplifying the semiconductor device according to the sixth embodiment, and shows a cross-section of a XVIIIc-XVIIIc line in FIG. 18A.

FIG. 18A is a plan view exemplifying a semiconductor device according to the sixth embodiment. FIGS. 18B and 18C are cross-sectional views exemplifying a semiconductor device according to the sixth embodiment. FIG. 18B shows a cross-section of a XVIIIb-XVIIIb line of FIG. 18A, and FIG. 18C shows a cross-section of a XVIIIc-XVIIIc line of FIG. 18A.

As shown in FIGS. 18A, 18B, and 18C, the semiconductor device 6 of present embodiment has a gate resistance 20, and the carrier discharging portion 80 of the opening 25 is a parasitic MOS 81. In addition, the semiconductor device 6 includes isolation layer 46 that separates the semiconductor substrate 10 circularly along a periphery of the gate resistance 20 so as to surround the gate resistance 20 when viewed from the main surface 10a. The isolation layer 46 is, for example, a trench conductive layer provided inside the trench 42 formed in the semiconductor substrate 10. With such a configuration, the p-type diffusion layers 12 and 13 below the gate resistance 20 are made floating. Therefore, since it is not connected to the emitter potential, it does not function as a parallel capacitor. As a result, the variation of the resistance value of the gate resistance 20 is suppressed, and stable switching is enabled.

When the amount of carriers 15 to the floating layer fluctuates, a displacement current to the gate is generated and a potential fluctuates. However, in the present embodiment, a parasitic MOS 81 connected to the floating layer is formed to secure a carrier discharge path, so that the potential variation of the floating layer can be suppressed.

In addition, by increasing the thickness of the insulating film 50 such as PSG and SOG, the parasitic MOS 81 formed in the opening 25 of the gate resistance 20 and the capacitance of the emitter wiring 30 on the gate resistance 20 can be suppressed from increasing. Note that the p-type diffusion layer below the gate pad 40 can suppress the variation of the floating potential by connecting to the emitter potential.

Next, the results of confirming the capacitance reduction effects by floating isolation using simulations (TCAD) will be described. A conventional structure (referred to as a structure A) in which a capacitance is added below the gate resistance 20 without separating the p-type diffusion layer below the gate resistance 20, and a structure (referred to as a structure B) in which the p-type diffusion layer below the gate resistance 20 is separated and the p-type diffusion layer is floated are compared. According to this, it was confirmed that the capacity drastically decreased in the case of the structure B.

The effect on the switching characteristics will be described with reference to the results of the verification performed by the circuit simulation. The verification method used is a general L load switching circuit and is a double pulse test. According to this, in the case of the conventional structure A, which has a $Rg_{int}$ parallel capacitance, the gate waveform greatly vibrates on the turn-on side of the structure A. Similarly, vibration of the gate waveform was also confirmed on the turn-off side. It is considered that the capacitance acts as a path at the time of the gate charge, and causes a speed change and a gate vibration.

From this, it is confirmed that there are two factors that cause imbalance, which is a problem of the conventional structure A. One is to vary the gate resistance, i.e. to reduce the gate resistance. The other is that the capacity acts as a path. In order to stabilize the switching, it is necessary to eliminate the above-mentioned factors. In the structure B in which the p-type diffusion layer of the present embodiment is made floating, it is possible to suppress the change of the switching speed and the gate vibration and to perform stable switching.

Although each embodiment has been described above, the present invention is not limited to the above-described form, and can be changed within a range not deviating from the technical idea. Also, a semiconductor device in which the configurations of the first to sixth embodiments are combined is within the scope of the technical idea.

What is claimed is:

1. A semiconductor device comprising:
    a gate resistance provided over a main surface of a semiconductor substrate;
    a carrier discharging portion formed in the semiconductor substrate below the gate resistance; and
    a first contact and a second contact connected to an upper surface of the gate resistance,
    wherein the first contact and the second contact extend in a first direction that extends along a plane parallel to the main surface in plan view,
    wherein the first contact and the second contact are placed at a distance from each other along a second direction, the second direction extending along the plane parallel to the main surface and being orthogonal to the first direction in plan view,
    wherein the gate resistance comprises:
        a first contacting portion extending in the first direction in plan view, the first contacting portion being connected to the first contact;
        a second contacting portion extending in the first direction in plan view, the second contacting portion being connected to the second contact; and
        a plurality of extending portions extending in the second direction in plan view such that 1) one end of the extending portions extending in the second direction is orthogonally connected to the first contacting portion extending in the first direction in plan view and 2) another end of the extending portions extending in the second direction is orthogonally connected to the second contacting portion in the first direction in plan view,
    wherein the gate resistance has an opening formed between adjacent extending portions and between the first contacting portion and the second contacting portion in plan view such that a perimeter of the opening is formed of the adjacent extending portions, the first contacting portion, and the second contacting portion in plan view, and connected to a gate electrode of a transistor via the first contact or the second contact,
    wherein the carrier discharging portion is formed under the opening, and
    wherein the carrier discharging portion comprises:
        a drift layer of a first conductivity type formed in the semiconductor substrate;
        a first diffusion layer of a second conductivity type formed on the drift layer; and
        a wiring coupled to the first diffusion layer through a third contact.

2. The semiconductor device according to claim 1, wherein the carrier discharging portion further comprises:
    a trench electrode provided inside a trench formed circularly in the main surface side of the semiconductor substrate;
    a trench insulating film formed between the semiconductor substrate and the trench electrode; and
    a second diffusion layer of the second conductivity type formed in a portion outside the circular trench electrode, and
    wherein the first diffusion layer is surrounded by the trench.

3. The semiconductor device according to claim 2, wherein the wiring is further connected to the trench electrode.

4. The semiconductor device according to claim 1, wherein the extending portion includes a solid film formed on the main surface.

5. The semiconductor device according to claim 1, wherein the carrier discharging portion further comprises:
    a trench electrode provided inside a trench formed circularly in the main surface of the semiconductor substrate; and
    a trench insulating film formed between the semiconductor substrate and the trench electrode,
    wherein the first diffusion layer of the second conductivity type is formed outside portion of the trench electrode formed circularly in a plan view.

6. The semiconductor device according to claim 5, wherein the third contact has circularly portion so that the third contact surrounds the trench.

7. The semiconductor device according to claim 1, wherein the extending portion comprises a trench conductive layer provided inside a trench formed in the semiconductor substrate.

8. The semiconductor device according to claim 2, further comprising:
    an isolation layer isolating the semiconductor substrate circularly along a periphery of the gate resistance so as to surround the gate resistance in a plan view of the main surface.

9. The semiconductor device according to claim 8, wherein the isolation layer is a trench conductive layer provided inside a trench formed in the semiconductor substrate.

10. The semiconductor device according to claim 1, wherein the first contact and the second contact are formed of a plurality of contacts extending in the first direction and separated in the second direction.

11. The semiconductor device according to claim 1, wherein the first contact is coupled to a gate pad and the second contact is coupled to an active cell.

12. The semiconductor device according to claim 1,
    wherein the semiconductor substrate includes an active cell portion and a gate resistance portion in a plan view of the main surface, and
    wherein an IGBT is formed in the active cell portion and the gate resistance is formed in the gate resistance portion.

* * * * *